(12) United States Patent
Kim et al.

(10) Patent No.: US 9,880,393 B2
(45) Date of Patent: Jan. 30, 2018

(54) NANO-OPTIC REFRACTIVE OPTICS

(75) Inventors: Hong Koo Kim, Pittsburgh, PA (US); Yun-Suk Jung, Clifton Park, NY (US); Yonggang Xi, Fairfax, VA (US)

(73) Assignee: University of Pittsburgh—Of the Commonwealth System of Higher Education, Pittsburgh, PA (US)

( * ) Notice: Subject to any disclaimer, the term of this patent is extended or adjusted under 35 U.S.C. 154(b) by 1209 days.

(21) Appl. No.: 13/811,079

(22) PCT Filed: Jul. 21, 2011

(86) PCT No.: PCT/US2011/044805
§ 371 (c)(1),
(2), (4) Date: Jun. 12, 2013

(87) PCT Pub. No.: WO2012/012608
PCT Pub. Date: Jan. 26, 2012

(65) Prior Publication Data
US 2013/0247973 A1    Sep. 26, 2013

Related U.S. Application Data

(60) Provisional application No. 61/366,809, filed on Jul. 22, 2010, provisional application No. 61/412,957, filed on Nov. 12, 2010.

(51) Int. Cl.
*G02B 27/12* (2006.01)
*G02B 5/00* (2006.01)
(Continued)

(52) U.S. Cl.
CPC ............. *G02B 27/12* (2013.01); *B05D 3/107* (2013.01); *B05D 5/06* (2013.01); *B82Y 20/00* (2013.01);
(Continued)

(58) Field of Classification Search
CPC ........................................................ G02B 5/008
(Continued)

(56) References Cited

U.S. PATENT DOCUMENTS 6,400,509 B1 * 6/2002 Sappey ................ G02B 5/1861
                                                   359/569
2003/0227415 A1    12/2003 Joannopoulos et al.
(Continued)

FOREIGN PATENT DOCUMENTS

AU     2009 100 376     5/2009
CN     1866063 A        11/2006
(Continued)

OTHER PUBLICATIONS

Chinese Search Report issued in related Chinese Patent Application No. 201180045778.9, dated Sep. 1, 2014.
(Continued)

*Primary Examiner* — Kimberly N Kakalec
(74) *Attorney, Agent, or Firm* — Foley & Lardner LLP

(57) ABSTRACT

A vertical dipole array structure includes a substrate that supports a film, which is not comprised of a negative-index metamaterial. The film includes a plurality of tilt-oriented portions and apertures. At least two of the tilt-oriented portions are separated by an aperture, and the tilt-oriented portions are configured such that incident radiation is redirected into a negative or positive refraction direction.

23 Claims, 25 Drawing Sheets

(51) Int. Cl.
*H01L 31/054* (2014.01)
*H01L 31/0224* (2006.01)
*B05D 3/10* (2006.01)
*B05D 5/06* (2006.01)
*G02B 5/18* (2006.01)
*B82Y 20/00* (2011.01)

(52) U.S. Cl.
CPC ............ *G02B 5/008* (2013.01); *G02B 5/1861* (2013.01); *H01L 31/022425* (2013.01); *H01L 31/0543* (2014.12); *G02B 2207/101* (2013.01); *Y02E 10/52* (2013.01)

(58) Field of Classification Search
USPC .............................. 359/2, 558–576, 742–743
See application file for complete search history.

(56) References Cited

U.S. PATENT DOCUMENTS

| | | | |
|---|---|---|---|
| 2004/0090678 A1* | 5/2004 | Cho ......................... | G02B 3/08 359/566 |
| 2005/0078374 A1 | 4/2005 | Taira et al. | |
| 2005/0161589 A1 | 7/2005 | Kim et al. | |
| 2007/0111366 A1 | 5/2007 | Odom et al. | |
| 2007/0217008 A1* | 9/2007 | Wang ................... | G02B 5/1809 359/485.05 |
| 2008/0024873 A1* | 1/2008 | Kim ....................... | B82Y 20/00 359/642 |
| 2008/0185531 A1 | 8/2008 | Hyde et al. | |
| 2008/0304159 A1 | 12/2008 | Chen | |

FOREIGN PATENT DOCUMENTS

| | | |
|---|---|---|
| CN | 101692411 A | 4/2010 |
| JP | H06-020940 | 1/1994 |
| JP | 2002-357707 | 12/2002 |
| JP | 2004-061796 | 2/2004 |
| JP | 2005-115176 | 4/2005 |
| JP | 2007-223100 | 9/2007 |
| WO | WO 2009/126972 A2 | 10/2009 |
| WO | WO 2010/027753 A2 | 3/2010 |

OTHER PUBLICATIONS

Zhu et al., "Electromagnetic field generated by a vertifical electric dipole in a negative-index media coating a planar perfect conductor," *Chinese Journ. of Radio Science*, vol. 23, No. 4, pp. 678-685 (2008).
Notice of Reasons for Rejection issued in related Japanese Patent Application No. 2013-520861, dated Jan. 5, 2016.
Notice of Reasons for Rejection issued in related Japanese Patent Application No. 2013-520861, dated Apr. 7, 2015.
Lhuerette, E. et al., Negative index subwavelength arrays operating at 0.5 THz, The Forth EuCAP 2010, pp. 1-4, Apr. 12-16, 2010.
Orbons, S.M. et al., Nanoscale annular array metamaterials, ICONN 2006, pp. 466-469, Jul. 3-7, 2006.
PCT/US2011/044805 International Search Report dated Feb. 28, 2012.
Sun et al., "Refractive Transmission of Light and Beam Shaping with Metallic Nano-Optic Lenses," *Applied Physics Letters*, vol. 85, No. 4, pp. 642-644 (2004).
Australian Examination Report issued in related Australian Application No. 2011281097, dated Sep. 22, 2015.
Australian Examination Report issued in related Australian Patent Application No. 2011281097, dated Feb. 10, 2014.
Chinese Office Action issued in related Chinese Patent Application No. 2015104300279, dated Jul. 19, 2016.
Chinese Office Action issued in related Chinese Patent Application No. 2015104300279, dated Mar. 13, 2017.
Australia Examination Report issued in related Australian Patent Application No. 2016201147, dated Jun. 23, 2017.
Canadian Office Action issued in related Canadian Patent Application No. 2805796, dated May 15, 2017.
Extended European Search Report issued in related European Patent Application No. 11810390.2, dated Aug. 1, 2017.

* cited by examiner

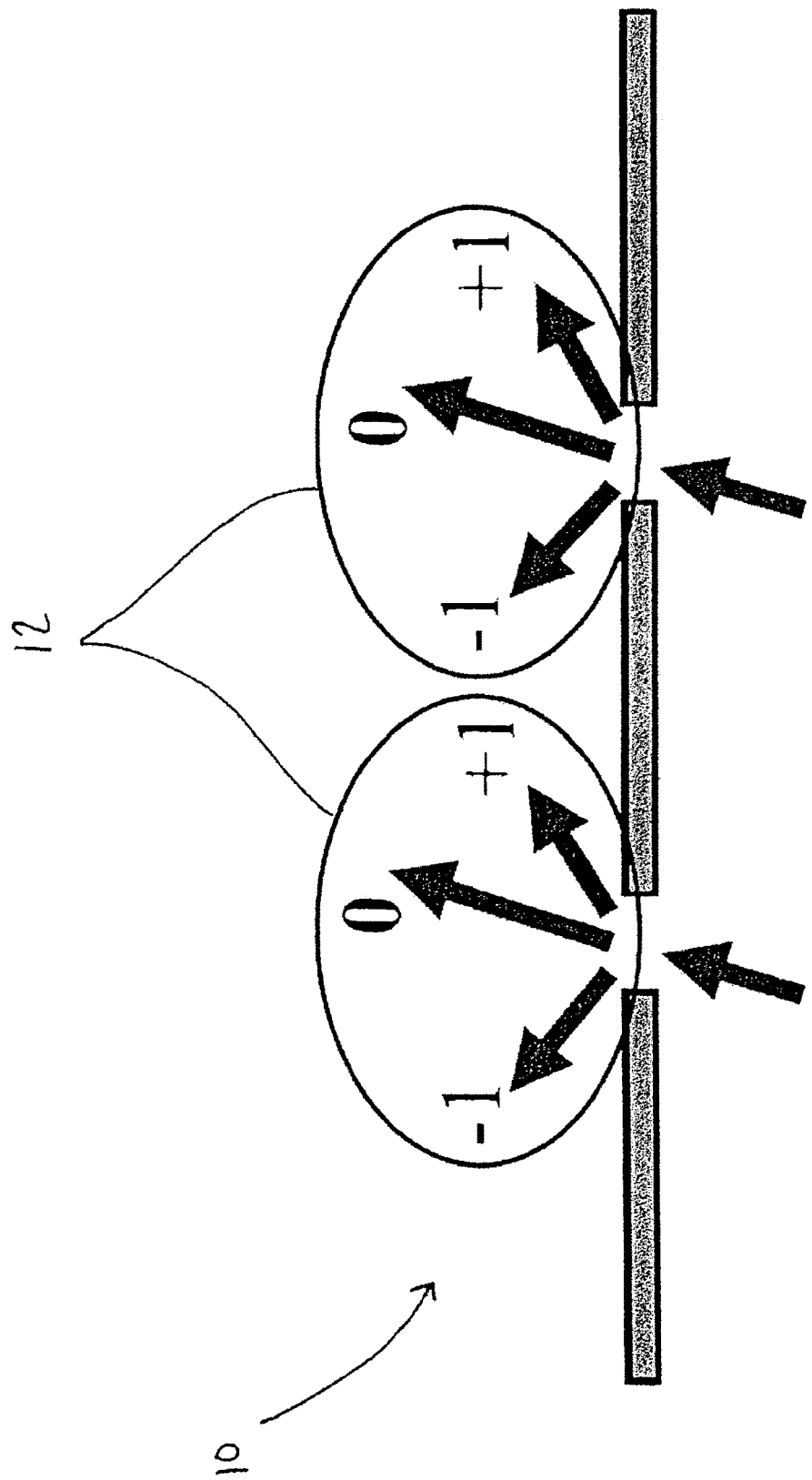

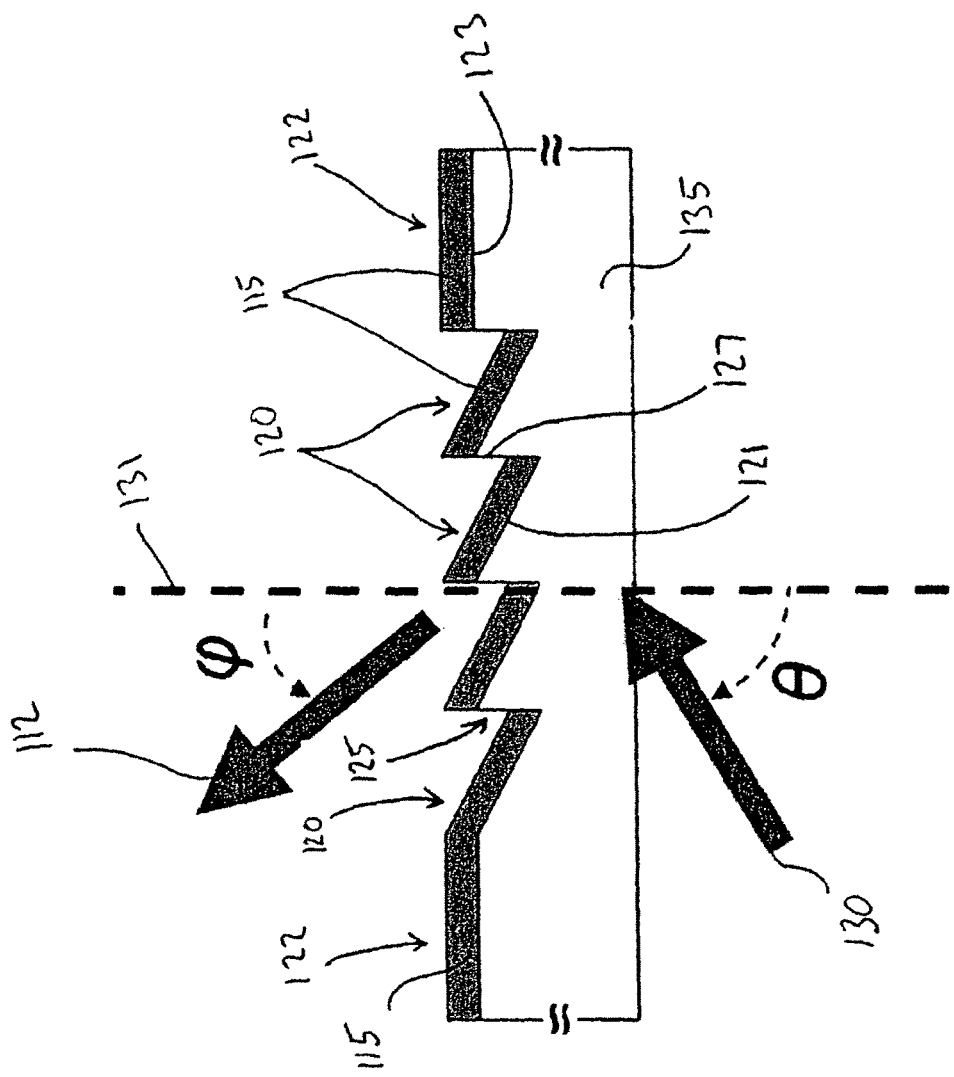

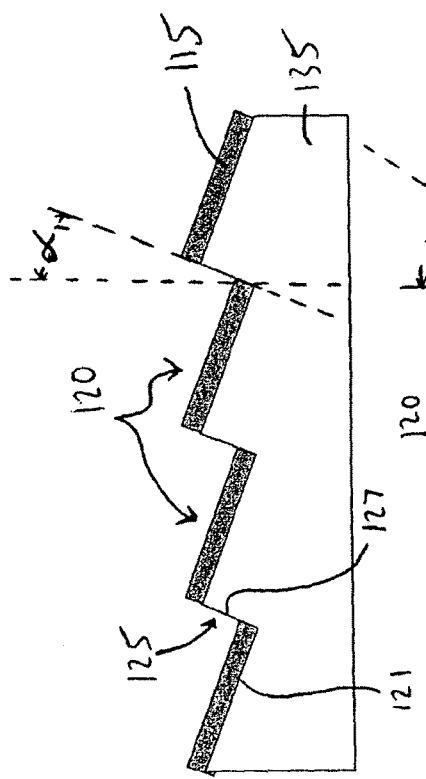
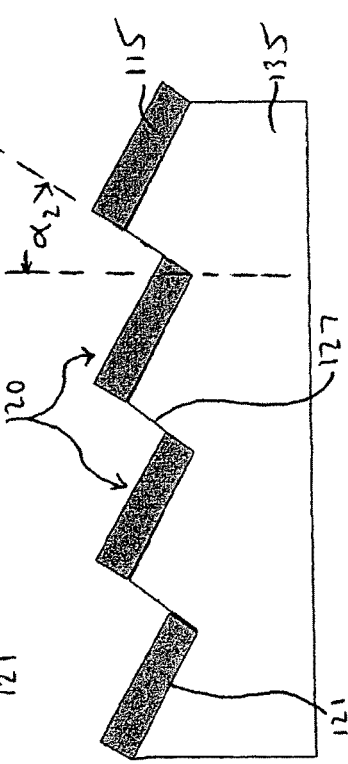
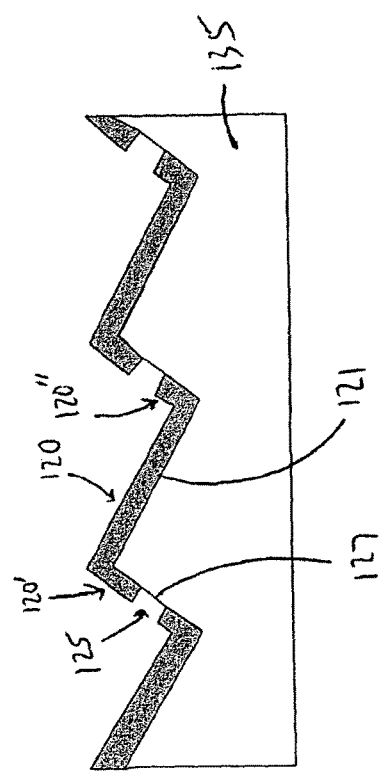
Figure 1d
Figure 1e
Figure 1f

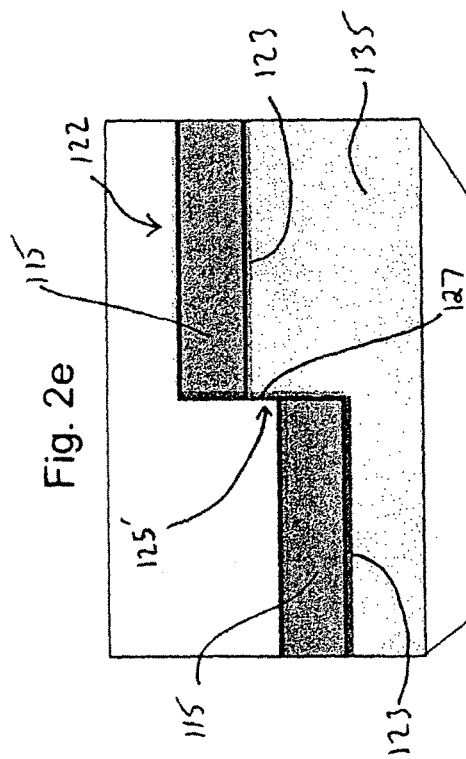
Fig. 2e
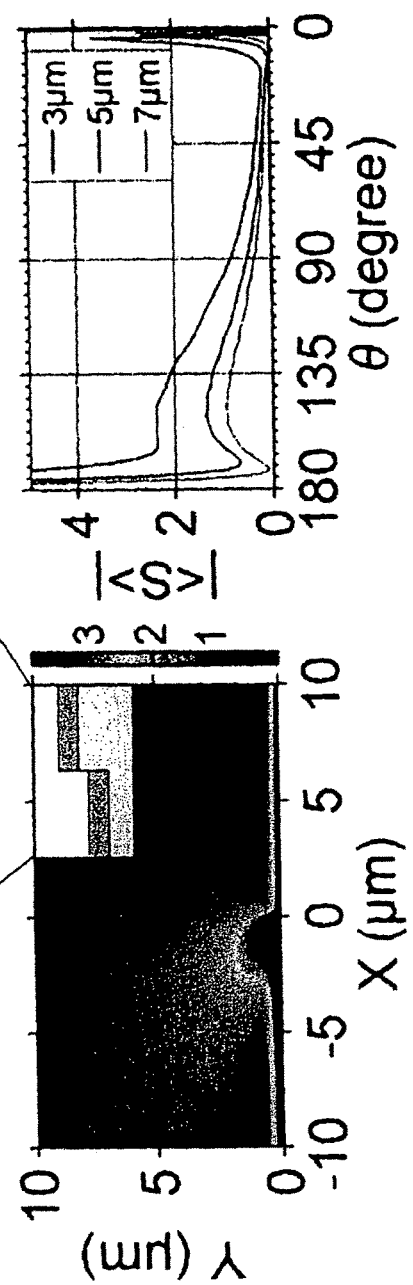
Fig. 2f
Fig. 2g

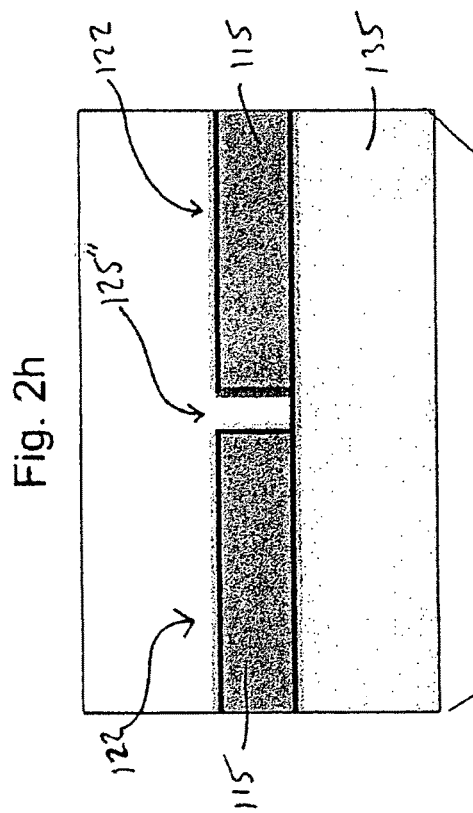
Fig. 2h
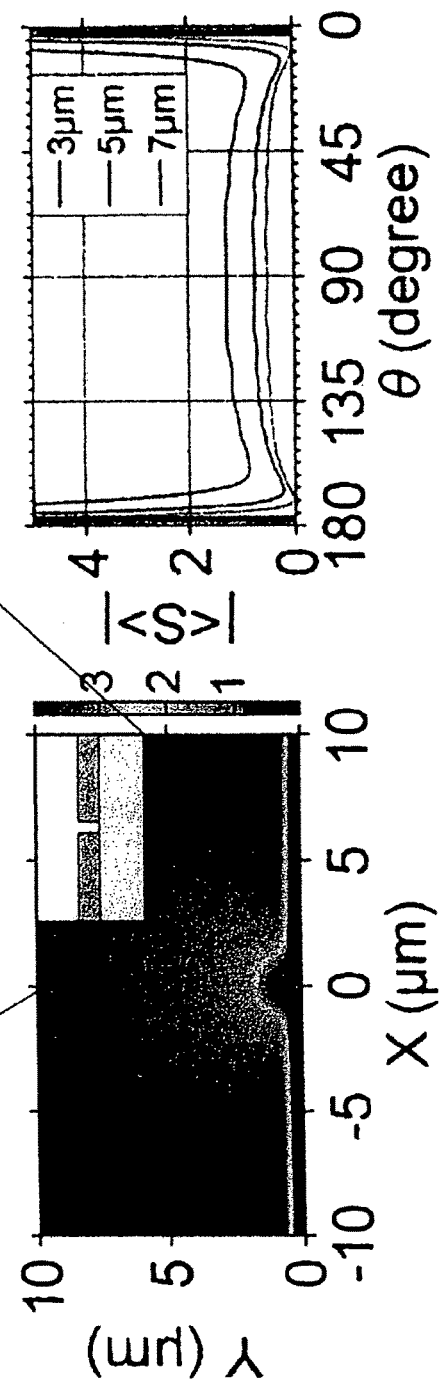
Fig. 2j
Fig. 2i

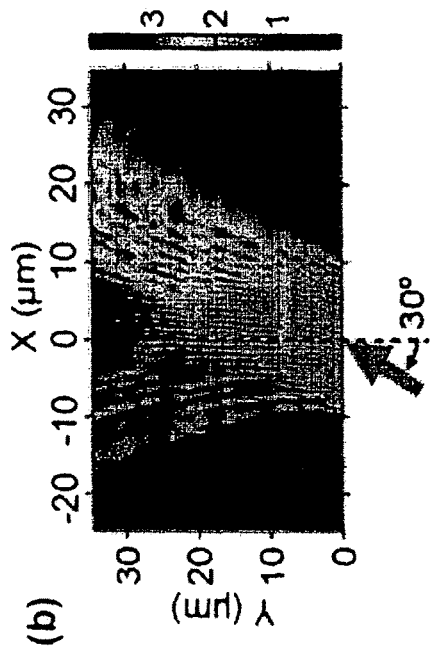
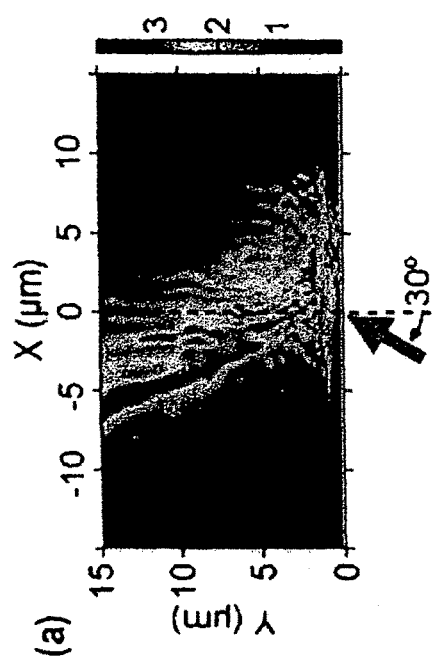
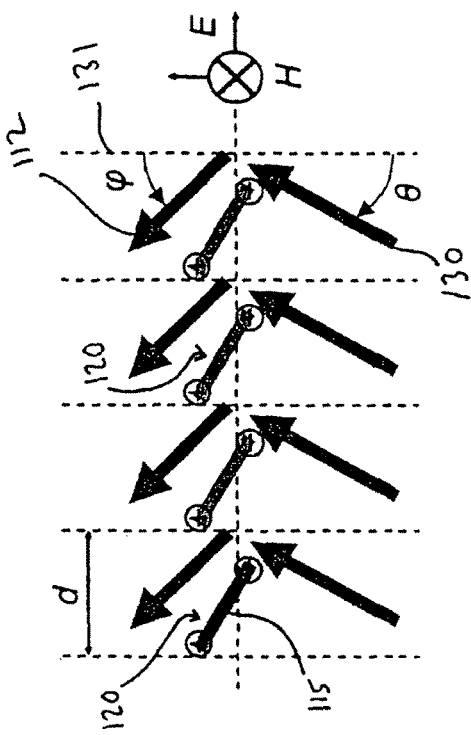
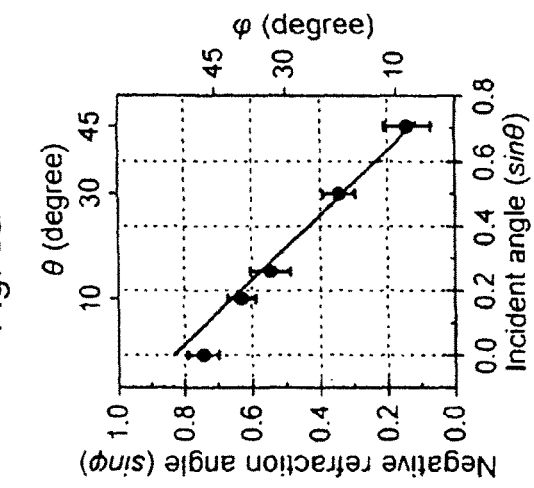
Fig. 3a
Fig. 3b
Fig. 3c
Fig. 3d

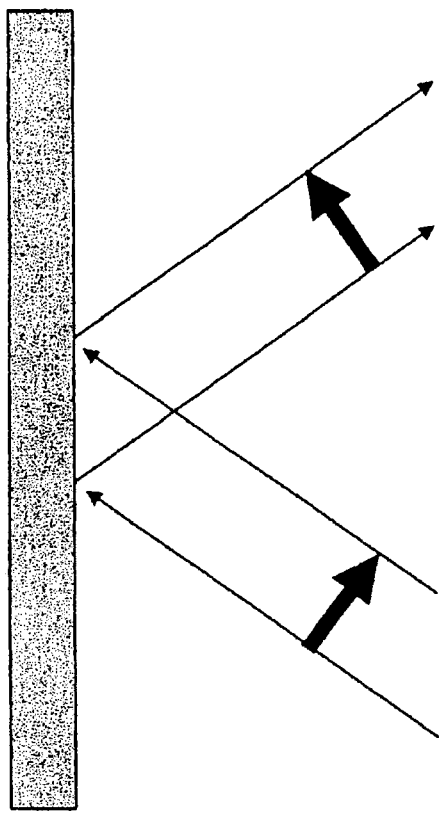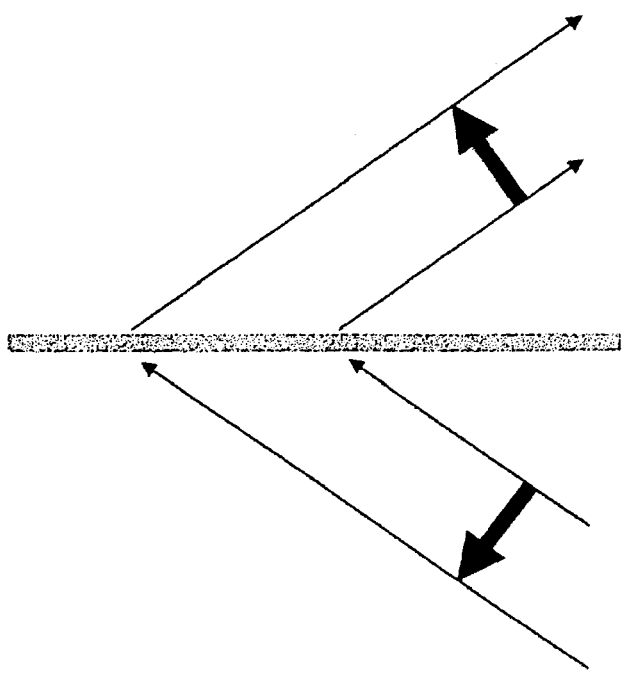

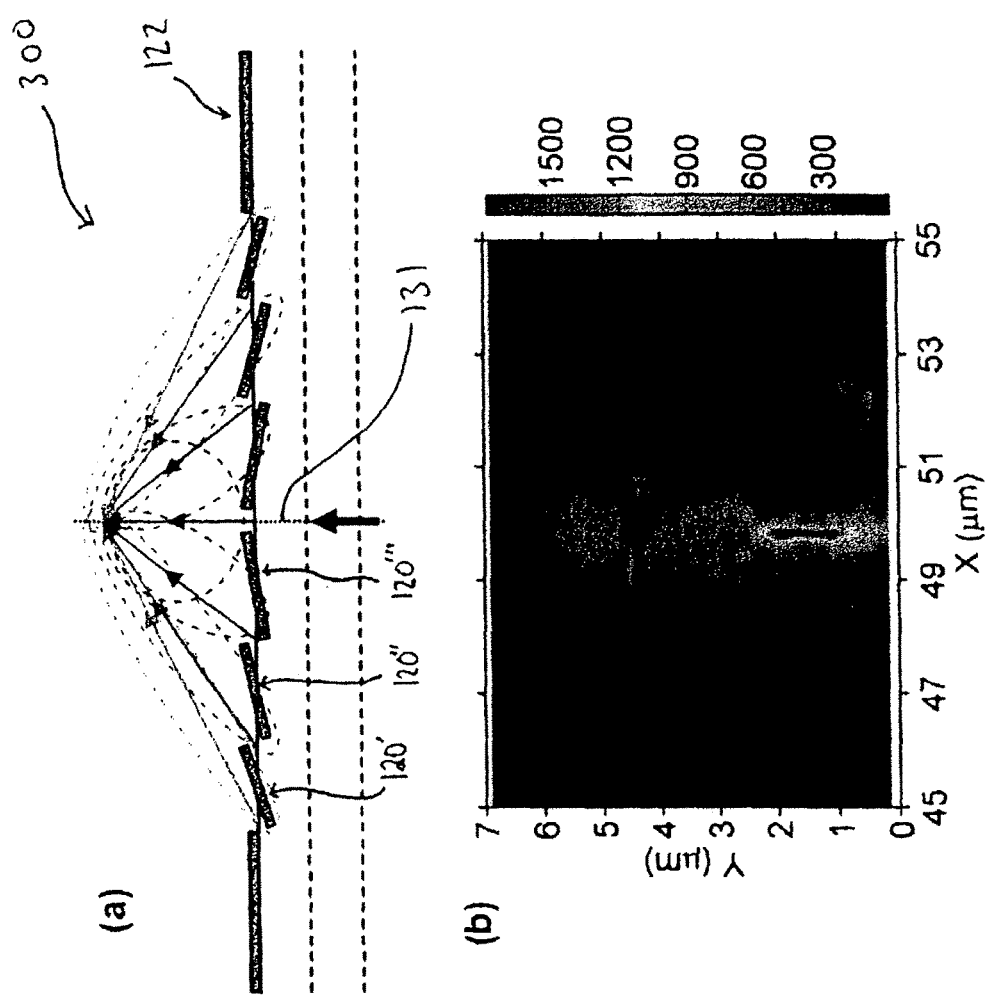
Figs. 5a-b

Figure 6b
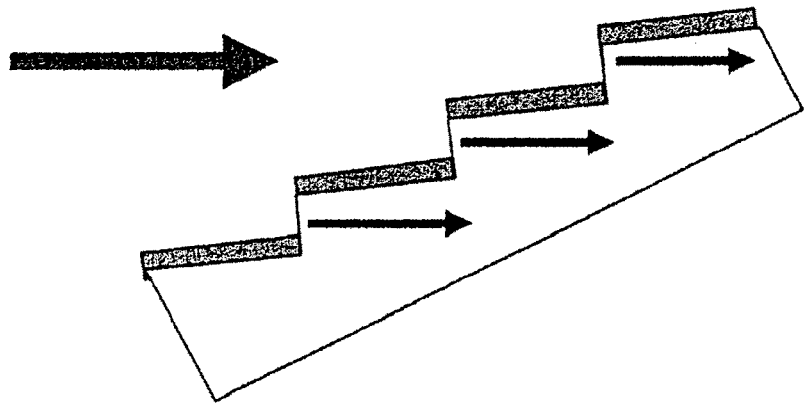
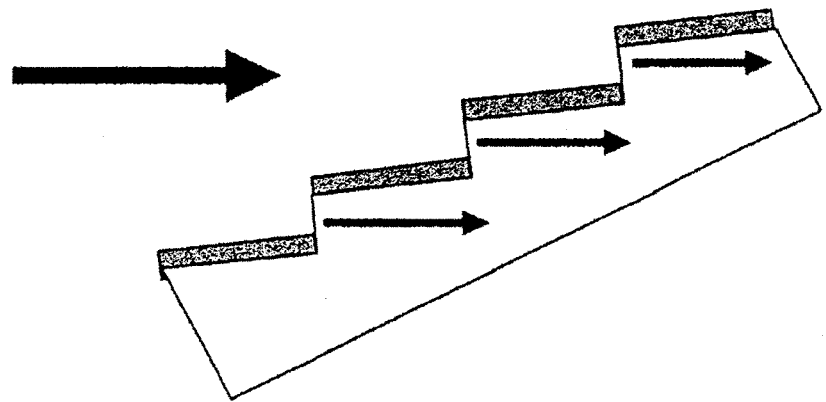
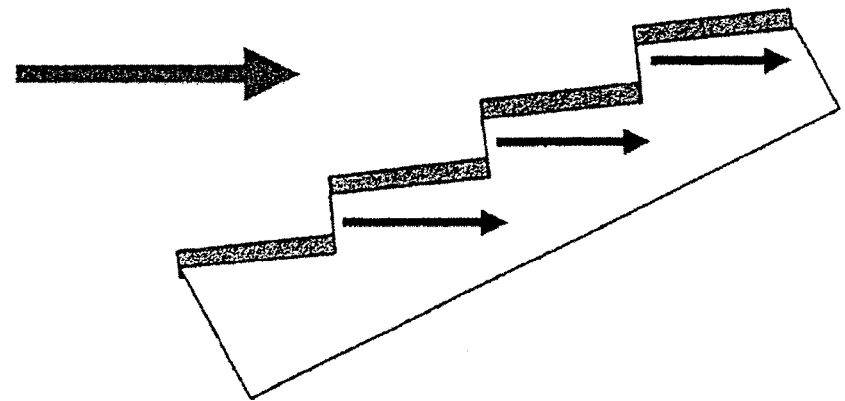

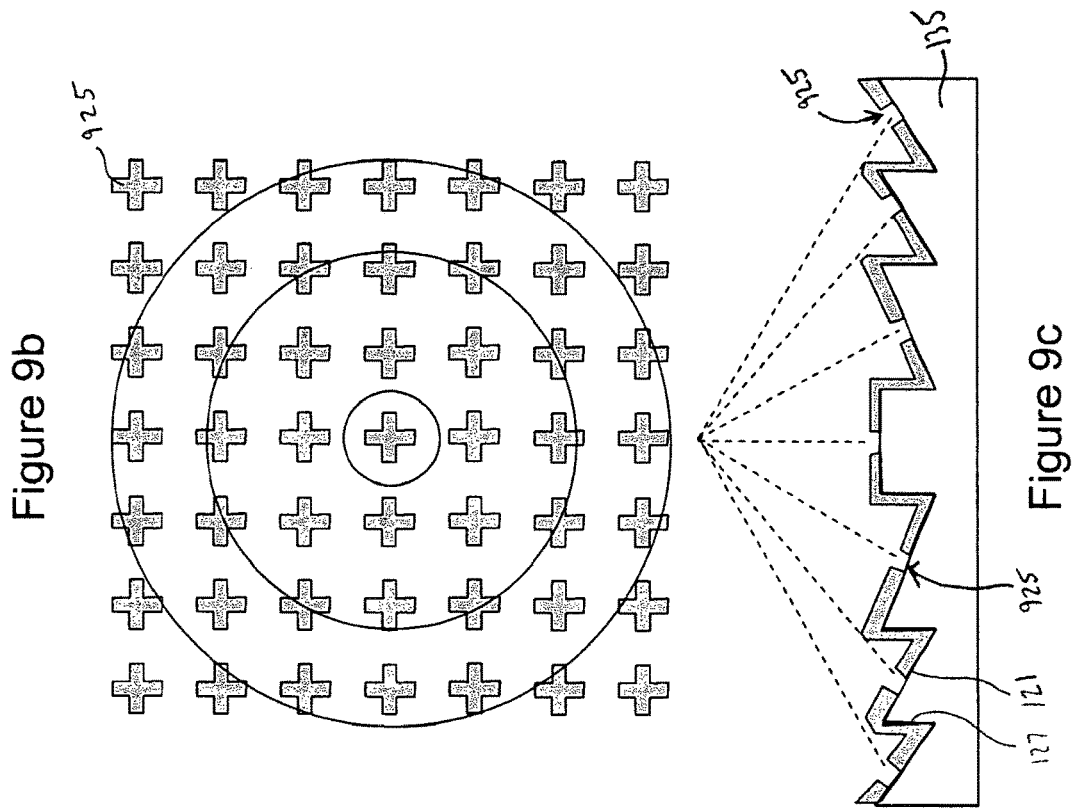
Figure 9b
Figure 9c
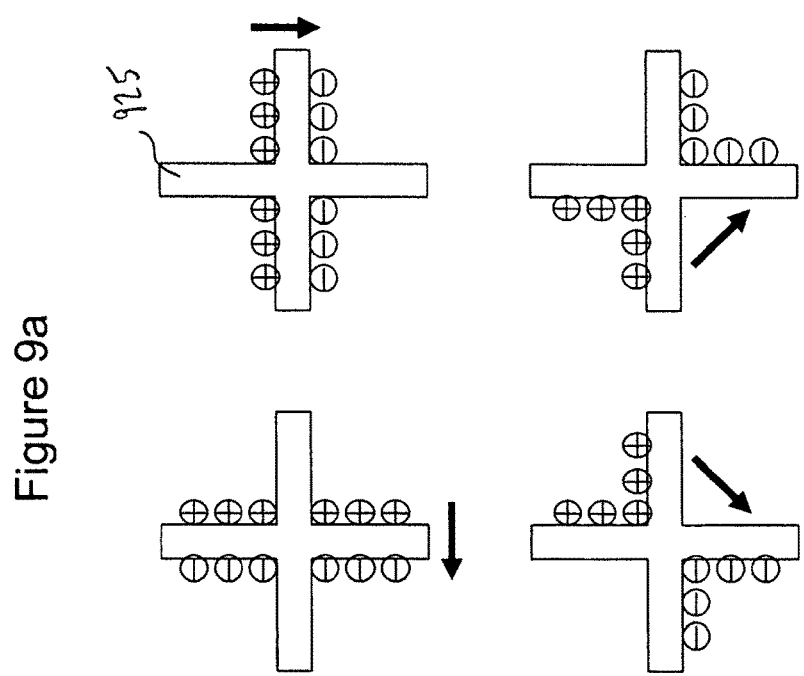
Figure 9a

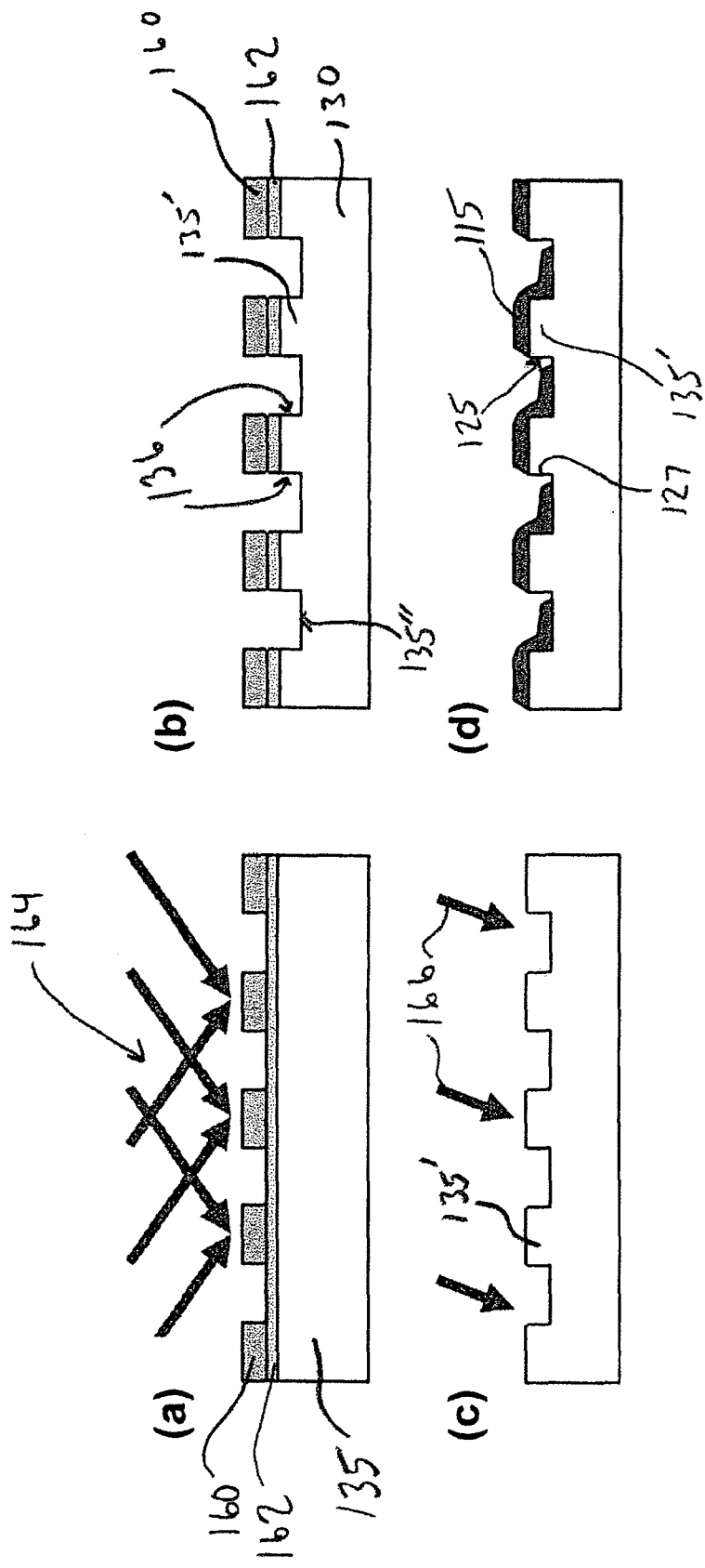
Figures 10a-d

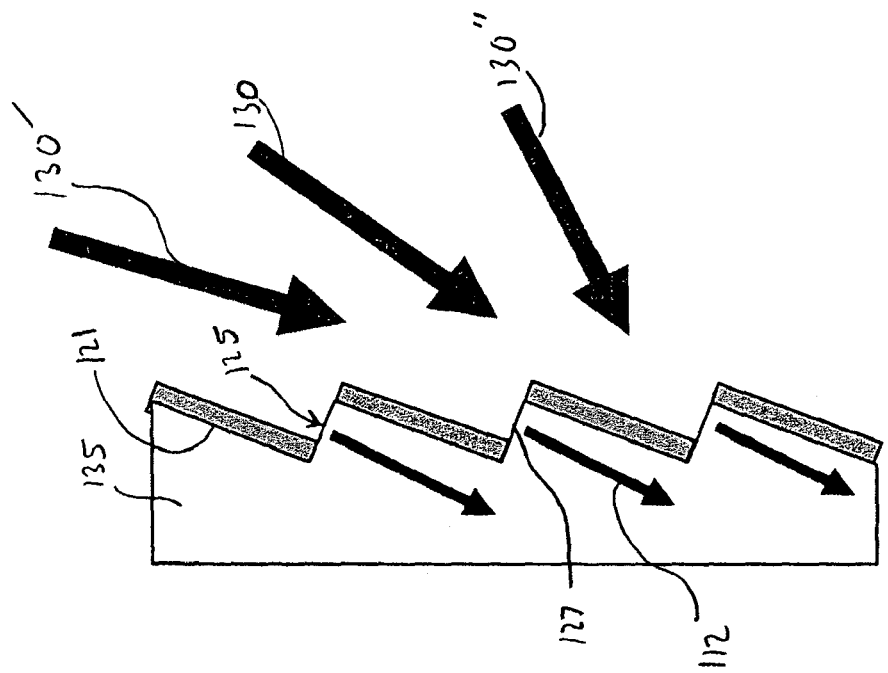
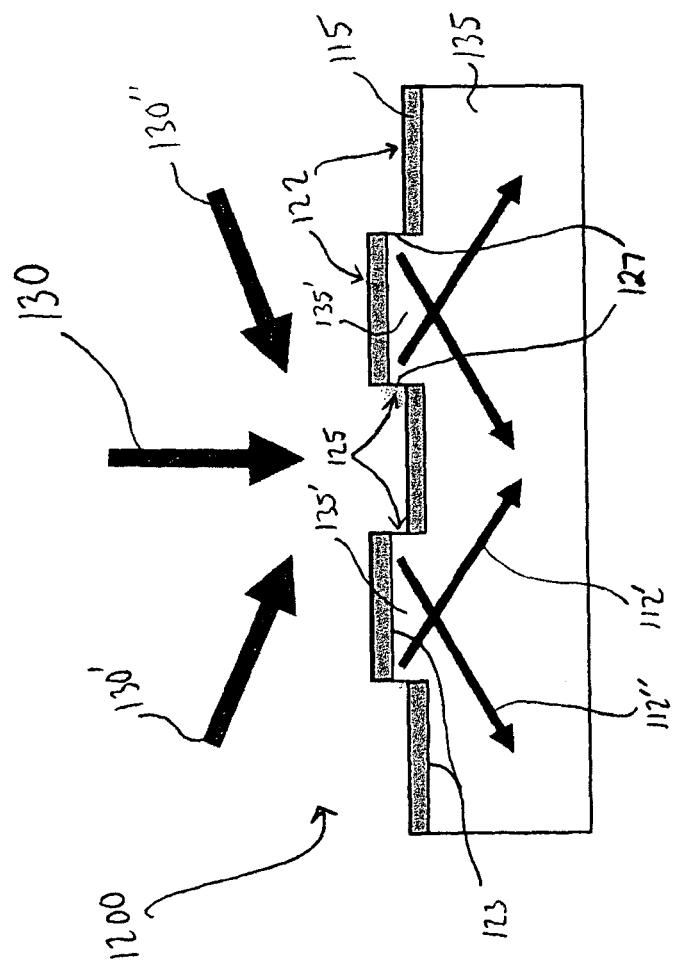
Fig. 12b
Fig. 12a

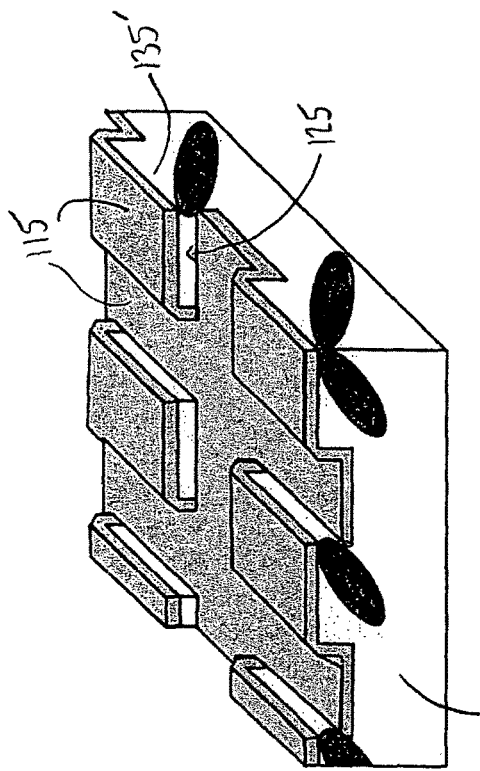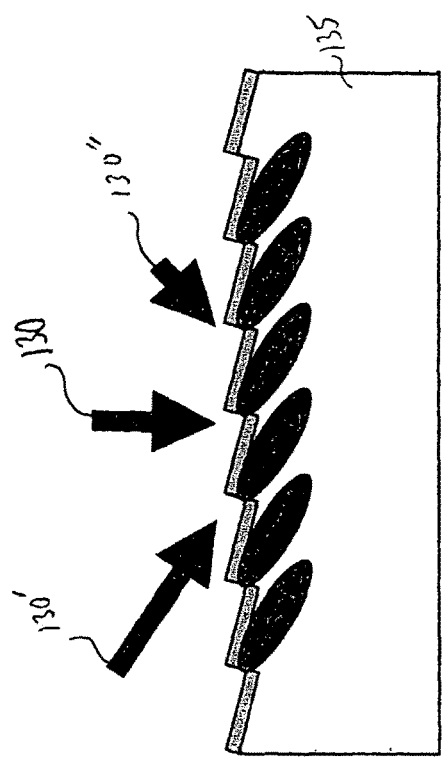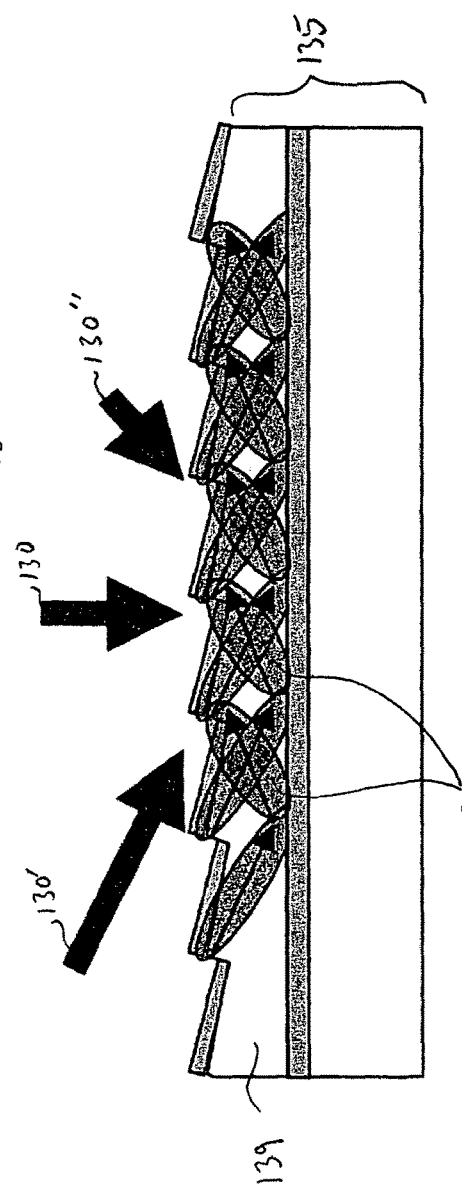
Fig. 13a
Fig. 13b
Fig. 13c

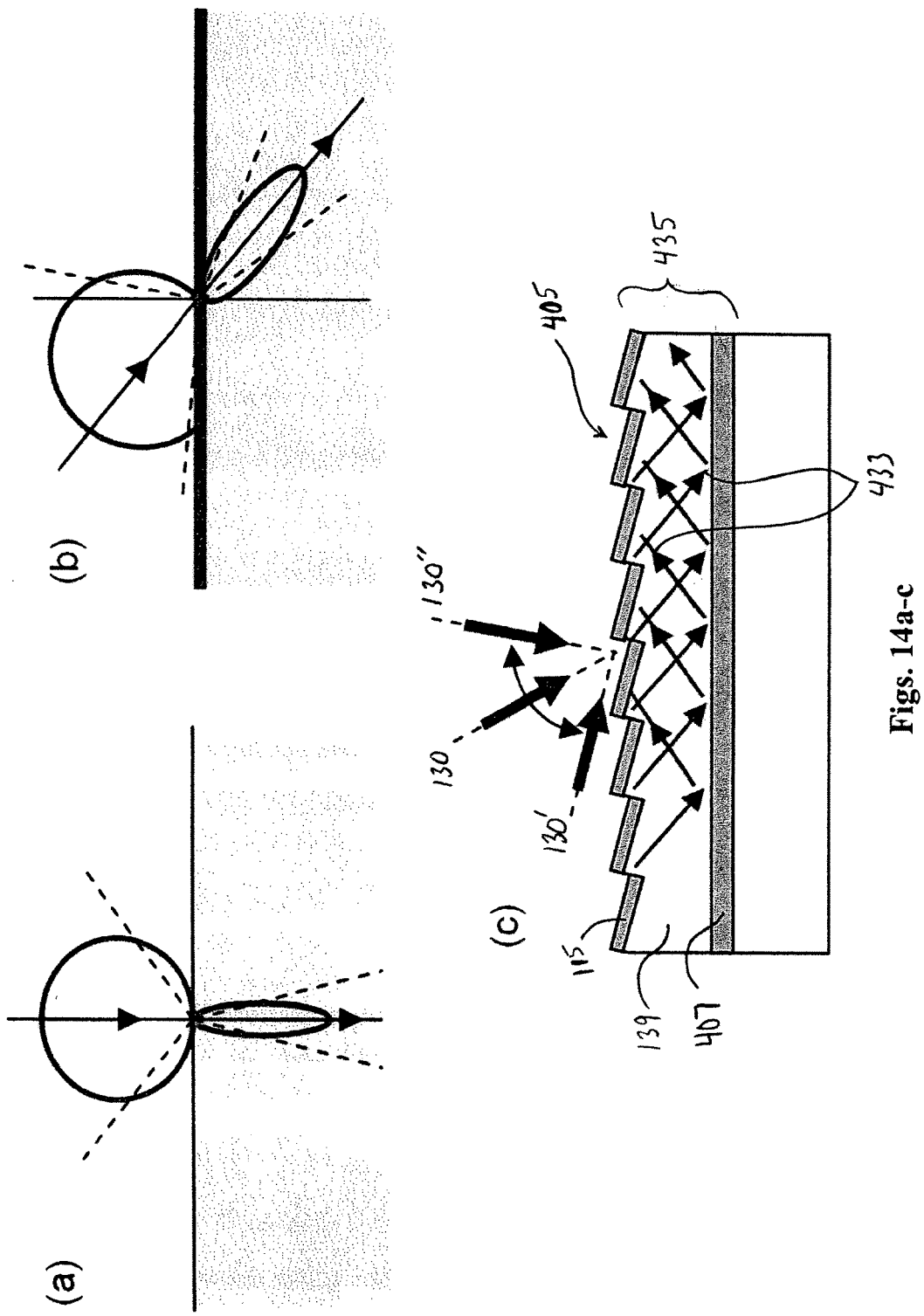
Figs. 14a-c

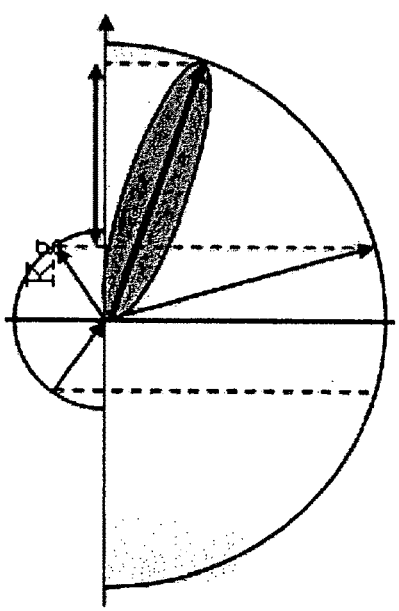
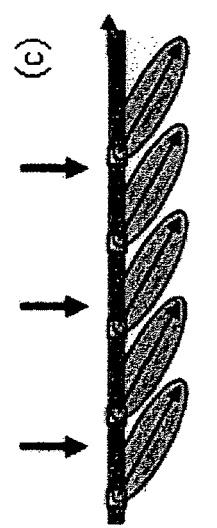
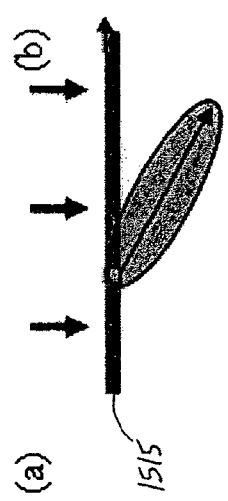
Figs. 15a-c

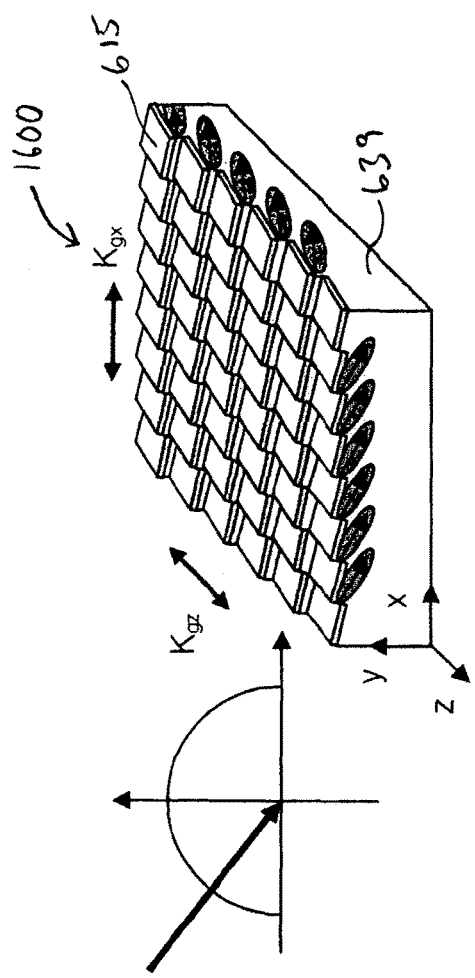
Fig. 16a
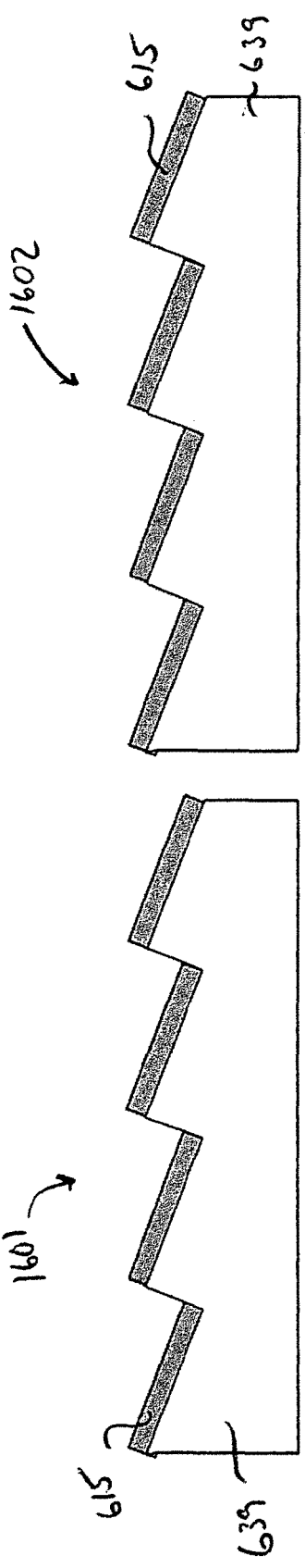
Fig. 16c
Fig. 16b

NANO-OPTIC REFRACTIVE OPTICS

RELATED APPLICATIONS

This application is a national stage of PCT/US2011/044805, filed Jul. 21, 2011, which claims priority to U.S. Provisional Application 61/366,809, filed on Jul. 22, 2010, and U.S. Provisional Application 61/412,957, filed on Nov. 12, 2010. The respective contents of these applications are incorporated here by reference in their entirety.

This invention was made with government support under ECS-0424210 awarded by the National Science Foundation. The government has certain rights in the invention.

FIELD OF THE INVENTION

The present invention is directed generally to optical devices and more particularly to nanostructured optical devices and methods of making the devices.

BACKGROUND OF THE INVENTION

Refraction of light at an interface of two different media forms an essential basis in imaging and beam-shaping optics. While commonly viewed as a macroscopic phenomenon occurring at an interface of bulk media, at a microscopic level, the phenomenon involves diffractive transmission of light through atomic or molecular level scatterers (re-radiators) and subsequent interference among the produced wavelets.

An intrinsic connection is evident between refraction and grating diffraction in that both phenomena involve diffractive transmission and interference. Yet, their differences lie at the vastly different length scales involved. That is, refraction occurs due to the atomic/molecular level spacing of scatterers and grating diffraction occurs due to wavelength scale aperture spacing.

In the case of an interface with an artificial medium whose refractive index is negative, light can be bent to a negative angle with the surface normal. However, negative-index metamaterials commonly involve resonant structures designed at a sub-wavelength scale, and are intrinsically associated with loss and limited spectral width of operation. Additionally, in conventional gratings, the transmitted power is mostly carried by the $0^{th}$ order diffraction (i.e., direct transmission), and other higher-order diffraction is usually of minor intensity. For example, the radiation pattern 12 of the conventional horizontal-dipole array 10 shown in FIG. 1a supports, the $0^{th}$ order (direct transmission) as the primary beam.

SUMMARY OF THE INVENTION

It is an object of the present invention to provide a structure that does not subscribe to the use of negative-index metamaterials to bend incident radiation into an arbitrarily-chosen, desired direction, i.e., negative or positive refraction direction. Instead, the present invention provides a grated structure that redirects incident radiation via higher-order diffractive transmission and interference through tilt-oriented nanoapertures.

In accomplishing the aforementioned goal, the present invention contemplates an array of nanoapertures formed, for example, in a metal thin-film. Each nanoaperture can be tilt-oriented from the film surface such that the radiation pattern directs to a particular orientation off from the substrate normal with reduced angular spreading. As an array, the aperture radiations make constructive interference into a specific direction that is designed to match the radiation patterns of individual apertures.

Accordingly, the invention provides a new type of thin film grating structure for diffracting light in bulk media. Depending on the incident beam direction, this grating structure enables either negative or positive refraction of the beam into far fields without propagation loss. For negative refraction, the grating structure is designed to primarily support the $-1^{st}$ order diffraction, while the $0^{th}$ order and other higher-order beams are suppressed for a wide range of incidence angle. For positive refraction, the grating structure utilizes preferentially the $+1^{st}$ order diffraction beam while suppressing other diffraction components. This grating diffraction with order-selection capability is enabled by engineering the radiation patterns of nanoapertures such that they can constructively interfere only in the direction of a selected diffraction-order.

In accordance with one aspect of the invention, there has been provided a vertical dipole array structure comprising (A) a substrate that supports (B) a film comprising a plurality of tilt-oriented portions, wherein (i) the film has a plurality of apertures, (ii) at least two of the tilt-oriented portions are separated by an aperture, (iii) the tilt-oriented portions are configured such that incident radiation is redirected into a negative refraction direction, and (iv) the film is not comprised of a negative-index metamaterial.

According to another embodiment, the invention provides a method for making a vertical dipole array structure. The inventive method comprises (A) providing a substrate and (B) forming a film on a surface thereof, wherein the film comprises an array of apertures and tilt-oriented portions but is not comprised of a negative-index metamaterial.

In accordance with yet another embodiment of the invention, a photovoltaic device is provided that comprises an electrode comprising a vertical-nanoaperture array formed on a film. The electrode is configured such that incident radiation is bent into a glancing angle direction without direct transmission through the film.

Pursuant to another aspect of the invention, a vertical dipole array structure is provided that comprises (A) substrate that supports (B) a film comprising a plurality of offset portions. In this regard, (i) the film has a plurality of apertures, (ii) at least two of the offset portions are separated by an aperture, (iii) the offset portions are configured such that incident radiation is redirected into an negative refraction direction, and (iv) the film is not comprised of a negative-index metamaterial. In a preferred embodiment, a surface of the substrate that supports the film comprises a mesa pattern as depicted, for instance, in FIG. 10.

In yet another aspect of the invention, a vertical dipole array structure is provided that comprises (A) a substrate that supports (B) a film comprising a plurality of tilt-oriented portions, wherein (i) said film has a plurality of apertures, (ii) at least two of said tilt-oriented portions are separated by an aperture, (iii) said tilt-oriented portions are configured such that incident radiation is redirected into a positive or negative refraction direction, and (iv) said film is not comprised of a negative-index metamaterial.

In an additional aspect of the invention, a photovoltaic device is provided that comprises (A) a mirror film, (B) a film formed on the mirror film, and (C) an electrode comprising a vertical-nanoaperture array formed on the film. In this regard, the electrode, film, and mirror film are configured as a Fabry-Perot cavity structure.

BRIEF DESCRIPTION OF THE DRAWINGS

FIG. 1a illustrates diffractive transmission of light through metal nanoaperture arrays in a conventional grating of horizontal-dipole apertures.

FIG. 1c is a cross-sectional view of a vertical-dipole nanoaperture array of an embodiment with a superimposed illustration of the resulting diffractive transmission of light through metal nanoapertures thereof.

FIGS. 1d-f are cross sectional views of variations of the vertical nanoaperture array structure shown in FIG. 1c.

FIGS. 2b-c are finite-difference time-domain (FDTD) simulations of radiation patterns of a single vertical nanoslit of FIG. 2a. FIG. 2b is a magnitude map and FIG. 2c is an angular profile of magnitude.

FIG. 2d is an experimentally measured beam profile of optical transmission through the single vertical nanoslit of FIG. 2a.

FIG. 2e is another embodiment of a single vertical nanoslit formed on an Ag layer. The dipole aperture is vertically oriented to the substrate.

FIGS. 2f-g are FDTD simulations of radiation patterns of the single vertical nanoslit of FIG. 2e. FIG. 2f is a magnitude map, FIG. 2g is an angular profile of magnitude.

FIG. 2h is a cross sectional view of a comparative single nanoslit formed on an Ag layer. The dipole aperture is horizontally oriented to the substrate.

FIG. 2i-j are FDTD simulations of radiation patterns of the single vertical nanoslit of FIG. 2h. FIG. 2i is a magnitude map, FIG. 2j is an angular profile of magnitude.

FIG. 3a shows the measured beam profile of a nanoslit array of an embodiment with vertical dipole apertures.

FIG. 3b is a measured beam profile of a conventional nanoslit array with in-plane horizontal dipole apertures.

FIG. 3c shows negative refraction angle measured as a function of incident angle. The solid line corresponds to a calculation based on Bragg's diffraction law.

FIG. 3d illustrates features of a vertical nanoslit array, such as that in FIG. 1b, used for describing or calculating beam characteristics by the Bragg law of diffraction gratings.

FIG. 4b illustrates a side-mirror function of a negatively refracting vertical-dipole nanoaperture array structure.

FIG. 4c illustrates conventional mirror imaging.

FIG. 5a shows a cross sectional view of an embodiment, for example a beam focusing lens based on vertical-nanoaperture array structure (vertical nanoslit array lens). Each nanoaperture radiation pattern is designed to orient to a common focal point. The phase retardation of each aperture transmission to the focal point is 2π-radian different from that of an adjacent aperture so that they can constructively interfere.

FIG. 5b shows a measured beam profile of a vertical nanoslit array lens.

FIG. 6b illustrates a laterally stacked solar panels. The solar radiation is obliquely incident to the nanoapertured electrode and propagates through the film in the glancing angle direction. The vertical nanoaperture array show extraordinary transmission of light for glancing angle incidence.

FIG. 9a illustrates cross-shaped 2D nanoaperture for polarization-independent 2D beam shaping functions.

FIGS. 9b-c are view of a 2D array of vertical nanoapertures for beam focusing function: FIG. 9b is a top view and FIG. 9c is a side view.

FIGS. 10a-d illustrate a holographic lithography and angle deposition process for fabricating vertical nanoaperture arrays on large area substrates. The mesa height and the metal thickness can be selected to produce vertical nanoapertures on one side of the mesa structure.

FIGS. 11a-11b are additional views of FDTD simulations of radiation patterns of a single vertical nanoslit of FIG. 2a. In FIG. 11a, which is the magnitude map of FIG. 2b, an arrow 130 and a vertical dashed line 135 are superimposed on the single vertical nanoslit and represent incident radiation and the substrate normal, respectively. FIG. 11b presents angular profiles of the radiation patterns for a vertical nanoslit (V) and a horizontal nanoslit (H); the legend indicates the angle θ of incident light relative to a substrate normal.

FIGS. 12a-12b are graphic representations of cross-sectional views of additional embodiments of a nanoslit array of the invention, used for absorption enhancement in thin film photovoltaic devices. The arrows indicate irradiance angles.

FIGS. 13a-13c illustrate additional cross-sectional views of a nanoslit array used, in accordance with the invention, for absorption enhancement in bulk and thin film photovoltaic devices.

FIG. 14a illustrates refractive transmission of light at a dielectric interface (air to silicon).

FIG. 14b illustrates that, depending on the ratio of the grating period of a grating structure formed on a dielectric structure to incident light wavelength, some diffraction beams can attain glancing angle transmission.

FIG. 14c illustrates schematically how combining a non-reciprocal transmission electrode with a reflector, forming a resonant cavity structure, results in the trapping of incident light into the active layer, which improves collection efficiency with less dependence on the material quality.

FIG. 15a illustrates a hypothetical nanoaperture structure and resulting radiation pattern.

FIG. 15b illustrates an array of the hypothetical nanoaperture structures of FIG. 15a, and a resulting radiation pattern.

FIG. 15c illustrates the phase matching condition (wave vector relationship) for the case of a dielectric surface covered with a hypothetical nanoaperture array of FIG. 15b.

FIG. 16a illustrates a 2D array of vertical nanoslits. For TE-polarization component (E=$E_z$ z), horizontal grating lines ($K_{gz}$: z-direction) are added. Vertically running gratings lines ($K_{gx}$: x-direction) are primarily for TM polarization.

FIG. 16b illustrates a cross sectional view of the 2D array of FIG. 16a and taken along the x-y plane.

FIG. 16c illustrates a cross sectional view of the 2D array of FIG. 16a and taken along the y-z plane.

DETAILED DESCRIPTION OF THE PREFERRED EMBODIMENTS

Figure 1B:
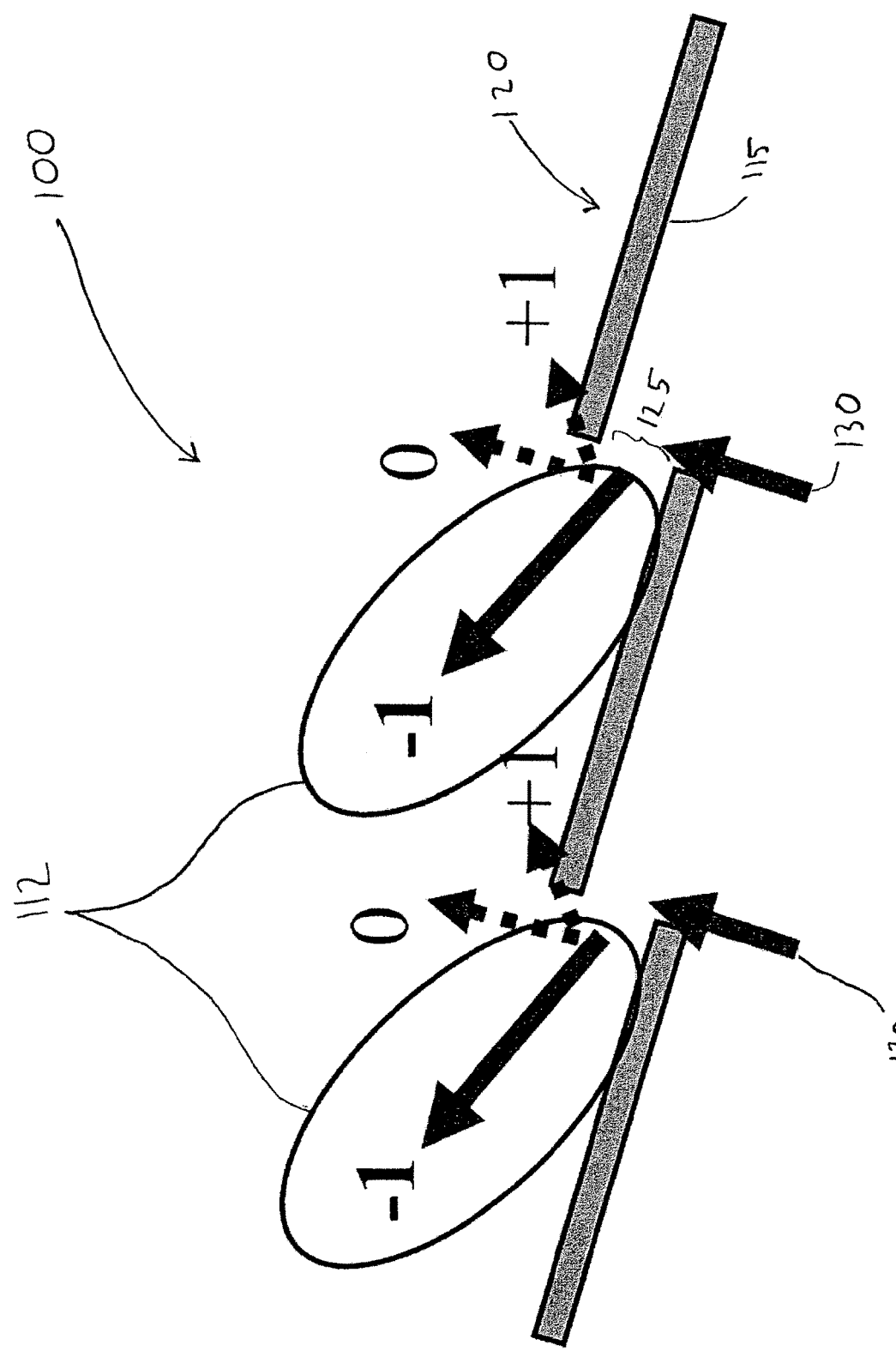
FIG. 1b illustrates diffractive transmission of light through metal nanoaperture arrays in a vertical-dipole nanoaperture array of an embodiment.

The phrases "vertical nanoaperture array," "vertical nanoslit array," "vertical-dipole array" and "array of vertical dipole apertures" are used interchangeably in this description.

Overcoming the Limits of Conventional Refractive Transmission at Dielectric Interfaces Refractive transmission of light at a dielectric interface is governed by the Snell's law that the transmission angle is determined by the ratio of refractive indices and incident angle. For a beam entering into a higher index medium, e.g., in the case of air to silicon (n~3.5), the maximum transmission angle is limited to ~16 degrees (FIG. 14a). A grating structure formed on the dielectric surface, such as metal wires or grids placed in periodic arrangement, can induce diffractive transmission. Depending on the ratio of the grating period to incident light wavelength, some diffraction beams can attain glancing angle transmission as illustrated in FIG. 14b. In conventional gratings, however, the transmitted power is mostly carried by the zero-order diffraction, whose maximum angle of transmission is limited and small for an interface of high index-contrast media, and other higher-order diffraction is usually of minor intensity. The difficulty in achieving high-throughput glancing-angle transmission stems from two reasons: First, the scattering pattern of individual diffractive element of conventional grating structure does not contribute much power to the glancing angle direction, therefore higher-order-diffraction beams of significant intensity cannot build up in that desired direction. Second, the diffractive elements' coverage of dielectric surface and their light coupling efficiency are usually low in conventional grating structures, therefore most incident power transmits through the dielectric surface without interacting with grating elements.

A hypothetical nanoaperture structure is illustrated in FIG. 15a. The nanoaperture structure is formed in an optically-thick metal film, and has a radiation pattern designed to be highly anisotropic, orienting incident light to a glancing angle direction. Since the dielectric surface is masked by metal, except for the nanoapertured region, the transmission of an incident light occurs only through that aperture. Therefore, the transmission characteristic is exclusively governed by the aperture radiation pattern itself, which is oriented to an oblique direction. Now compare the structure of FIG. 15a with an array of such hypothetical nanoapertures formed on a dielectric surface as illustrated in FIG. 15b. In FIG. 15b, interference among the aperture radiations can result in diffraction beams of different orders. The diffraction beam of particular order whose direction falls within the angular range of an aperture radiation pattern can have strong transmission, while other beams orienting to the direction outside the radiation pattern cannot develop into a propagating wave. FIG. 15c illustrates the phase matching condition (wave vector relationship) for the case of a dielectric surface covered with a hypothetical nanoaperture array. In this figure, the $+1^{st}$ order diffraction beam on the transmission side is designed to match the nanoaperture radiation pattern, that is, to orient to the glancing angle direction for oblique incidence, and the zero-order and other higher-order diffractions are suppressed. Here, the glancing angle transmission in high-index media is enabled by employing highly-directional nanoaperture radiation patterns and their interference effect, and the operating principle differs from those of conventional refraction at bulk dielectric interfaces. This new principle (selection of diffraction order by vertical dipole radiation pattern) can be applied to achieve negative refraction of light through a nanoaperture array as described below.

Negative Refraction Without Negative-Index Metamaterials

In contrast to the case of bulk metamaterials, which commonly suffer from high propagation-loss, the negative refraction achieved with nanostructured metal films in accordance with the invention can reach the far-field region without any such loss. Additionally, most metamaterials rely on resonance phenomena, and negative refraction is limited to narrow spectral ranges. On the other hand, the vertical-dipole-array structure of the invention allows for diffraction in negative refraction directions at arbitrary wavelengths. The negative refraction of light enabled at an interface of bulk media provides access to angular ranges that are not attained in conventional refractive optics. Thus, a nano-optic structure, such as a vertically-tilted nanoaperture array structure of the invention can serve as a platform for various applications such as optical beam shaping, imaging, lithography, optical data storage, information processing, instrumentation, metrology, and photovoltaics.

With reference to FIG. 1b, an inventive vertical nanoaperture array 100 is designed to support only the $-1^{st}$ order grating diffractions, which form a negatively-refracting beam 112. The vertical dipole array structure may comprise a substrate (not shown) that supports a film 115 comprising a plurality of tilt-oriented portions 120 and a plurality of apertures 125. At least two of the tilt-oriented portions 120 are separated by an aperture 125. The tilt-oriented portions can be configured such that incident radiation 130 is redirected into a negative refraction direction as shown by the negatively-refracting beam 112.

In keeping with the invention, film 120 is not comprised of a negative-index metamaterial, even for the case of a vertical dipole array structure configured such that incident radiation is redirected in a negative refraction direction. For example, film 120 can comprise a grated and periodically slanted, tilt-oriented or sloped film of a highly conducting material, i.e., a film of highly conducting material presenting an array of tilt-oriented nanoapertures. The highly conducting material can be selected from Ag, Au, Al, Cu, Cr, and the like, and/or or a highly conducting alloy thereof, graphene, graphite, or conducting oxides.

Film 115 can comprise tilt-oriented portions 120 and can be supported by a substrate 135, as shown in FIG. 1c. Adjacent tilt oriented portions 120 may be separated by at least one aperture 125. The tilt-oriented portions 120 separated by at least one aperture 125 may form a saw-tooth pattern supported by a substrate having a top-surface with a portion of the surface formed as saw-tooth pattern. For instance, each tooth of the saw-tooth pattern can include a vertical step surface 127 and a tilt-oriented, or sloped surface 121. The substrate also can include substantially horizontal portions 123 that support horizontal portions 122 of the film 115. Incident radiation 130 at angle θ to a substrate normal 131 is redirected at angle φ away from the substrate normal. Substrate 135 can comprise a material that is not a negative-index metamaterial.

The foregoing description of the invention is complemented by the following examples, which are illustrative only.

Single Nanoaperture

Figure 2B:
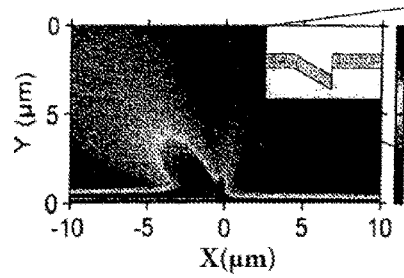
Figure 2A:
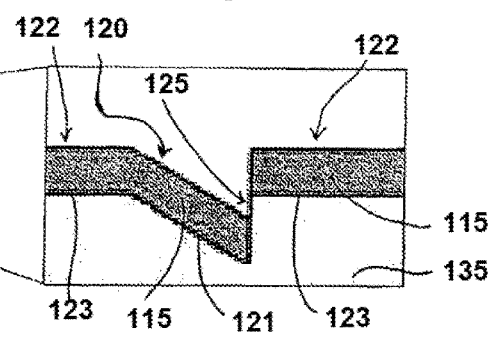
FIG. 2a is one embodiment of a single vertical nanoslit formed vertically oriented on an Ag layer. The dipole aperture is vertically oriented to the substrate.

Three different structures of a single nanoaperture or nanoslit, having a width of 60 nm formed on a Ag layer are shown in FIG. 2a (Example 1), FIG. 2e (Example 2) and FIG. 2h (Comparative Example 1). In FIG. 2a, a tilt-oriented portion 120 and horizontal portion 122 of a film 115 are supported by a substrate 135 and are separated by an aperture 125. In FIG. 2e, two horizontal portions 122 of a film 115, each of which are supported by substrate 135, and elevated from one another as defined by the vertical step surface 127 which includes aperture 125'. In FIG. 2h, two horizontal portions 122 of a film 115, each of which are supported by substrate 135 and not elevated from one another, are separated by an aperture 125".

Figure 2C:
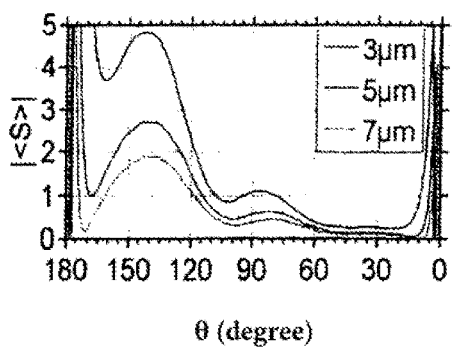

FDTD simulations of radiation patterns for each of the three different structures are shown in FIGS. 2b-2c, 2f-g, and 2i-j, respectively. FIGS. 2b, 2f, and 2i show Poynting vector distribution (magnitude map) while FIGS. 2c, 2g and 2j show angular profiles of magnitude. For each of the simulations, the dielectric constant of Ag was assumed to be −16+i1.1 at 633 nm and a TM-polarized light with 633 nm wavelength was incident normal to the substrate. The simulation window was 20 μm×15 μm. The FDTD results were generated using a 2D Yee mesh with 10-nm grid spacing and perfectly matched layer (PML) boundary conditions.

For a planar wave normally incident from the bottom side, the slit transmission shows a radiation pattern tilt-oriented from the substrate normal. For example, in FIG. 2c, the main lobe is oriented to the θ=140° direction (50° tilt from the substrate normal) with a full-width-at-half-maximum angle of 50°. This is in a clear contrast to the radiation pattern of a conventional slit whose dipole axis is horizontal, parallel to the film surface as that in FIG. 2h. The latter structure shows a nearly uniform distribution of power for radiation angles of 20°-160° (±70° from the substrate normal).

While not bound to any particular theory, it is believed that a tilt-nanoslit aperture configuration serves as a dipole-like line source that oscillates perpendicular to the metal film under excitation by an incident wave. For a transverse magnetic (TM)-polarized light incident to an aperture, the metal responds by inducing surface currents. The induced currents work differently at the opposing corners, that is, accumulating charges at one corner while depleting at the other. This dipole oscillation at the vertical aperture has the effect of re-radiating the incident energy into the direction tilted away from the substrate normal.

The amount of dipole charges induced on slit corners and edges depends on the aperture geometry/dimension and the orientation of incident field vectors with respect to the edges. An electromagnetic wave interacting with metal surface (edge of a slit) can induce polarization surface charges, whose surface charge density can be expressed as:

$$\sigma_{pol} = \varepsilon_0(E_2 - E_1) \cdot n_{21} = \varepsilon_0\left(1 - \frac{\varepsilon_D}{\varepsilon_M}\right)E_2 \cdot n_{21}.$$

Here $E_1$ and $E_2$ are the electric field on the metal and dielectric side of the interface, respectively, and $n_{21}$ is the normal vector to the surface. For most metals/dielectrics, $|\varepsilon_M| \gg |\varepsilon_D|$, therefore, the amount of dipole charges induced on the surface would not be critically dependent on the dielectric constant of metal. Charge induction in the corner region involves a different process. Reflection of an incident wave induces surface current J=n×H, where H is the total magnetic field on the surface. This surface current then induces local charges at the corner governed by the continuity equation. The resulting surface charge density can be expressed as $$\sigma = \frac{1}{i\omega}J = \frac{1}{i\omega}(1-r)H_{in}.$$

Here $H_{in}$ is the incident magnetic field at the metal surface and r is the reflection coefficient. For most metals the reflection coefficient remains close to −1, implying negligible dependence of the dipole charge density on metal's dielectric constant. Overall this analysis suggests that vertical nanoslits made of metals with different dielectric constants would show radiation patterns of similar dipole strength (transmission throughput).

Figure 2D:
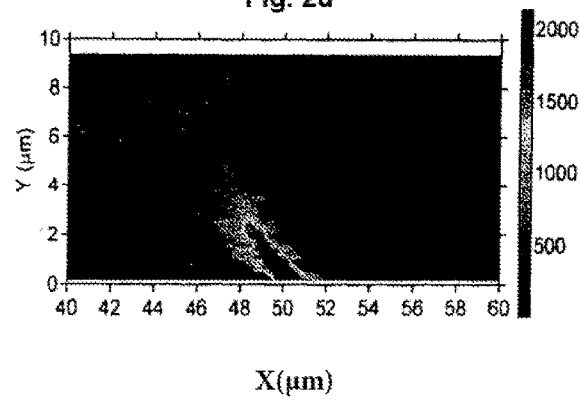

FIG. 2d shows an experimental measurement result of optical transmission through the vertical nanoslit structure of FIG. 2a. A comparison of both the simulations (FIGS. 2b-2c) and experimental results (FIG. 2d) confirms that the radiation pattern remains tilt-oriented off from the substrate normal, independent of incidence angle of an input beam.

The radiation angle and throughput depend on the geometry and dimension of nanoslit and the slant structure. As the lower step edge (bottom surface of a step) becomes less slanted (becomes more horizontal) the radiation pattern tilts more to the horizontal direction. For larger slit width, the slit transmission decreases. The transmission also shows dependence on film thickness, increasing for thicker films up to a certain thickness limit (~λ/4).

Figure 2K:
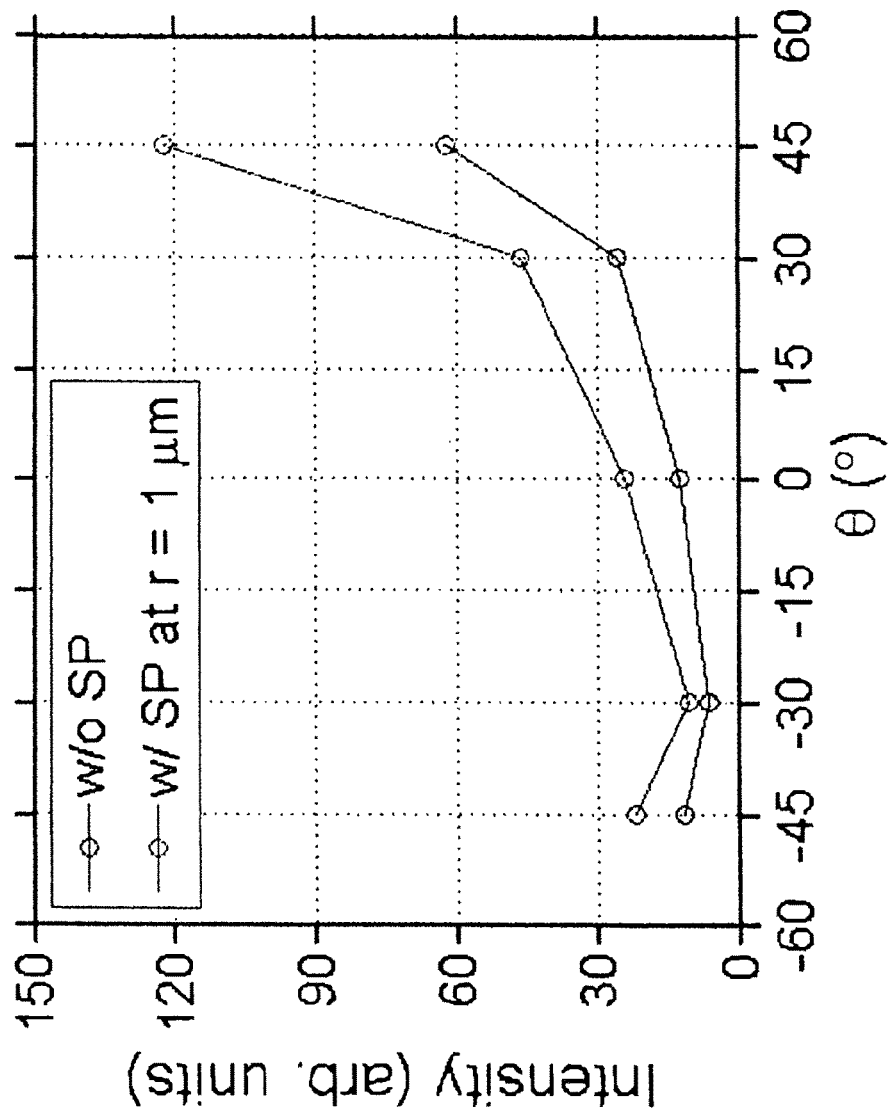
FIG. 2k shows the transmission throughput (intensity) of a vertical nanoslit calculated as a function of beam incidence angle. The integral power of transmission is calculated at r=1 micron with or without surface plasmon power taken into account. The transmission intensity calculated at normal incidence translates to 80% transmission efficiency.

The transmission throughput of a vertical nanoslit was also calculated as a function of beam incidence angle (FIG. 2k). While the radiation pattern orients to the same tilt angle, the throughput increases as the beam is incident more obliquely, that is, close to parallel to the aperture radiation direction. The transmission efficiency, defined as the total transmitted power (both free-space radiation and surface plasmon power) divided by the incident power that falls on the slit cross-section, reaches 80% level at −45-degree incidence or normal incidence and 400% at +45-degree incidence. (Here the transmission efficiency's being greater than 100% indicates a funneling effect that the nanoslit efficiently captures and transmits incident power more than the amount that falls on the aperture area.) This angular dependence indicates that the dipole charges are maximally induced when the incident electric field vector orients to the same direction as the dipole axis. For the case of a horizontal slit with same metal thickness and slit width, the transmission efficiency reaches maximum 53% at normal incidence. It is interesting to note that a vertical nanoslit structure can outperform a horizontal nanoslit in transmitting incident power. For thicker films, this performance contrast becomes even stronger, and this can be understood in view of the fact that in horizontal nanoslits a significant amount of transmission loss occurs in the narrow channel region whereas in the vertical slit case there is no such waveguide constriction and therefore no attenuation. The high throughput transmission and a highly directed radiation pattern of the vertical nanoslit structure offers interesting potential for overcoming the limits of conventional refractive optics.

Variations of Vertical Nanoaperture Structure

The geometries of vertical nanoaperture can be varied in many different ways while keeping the essence of tilted dipole nanoaperture (See FIGS. 1d-f). By allowing a gap in the lateral direction, the transmission throughput can be increased. By forming a nanoaperture on a less sloped side of a saw-tooth surface, the aperture radiation direction can be more easily adjusted to the desired direction. Accordingly, vertical step surfaces 127 of FIG. 1c are not limited to completely vertical orientation, and a tilt-oriented portions 120 of film 115 are not limited to being formed only on sloped surfaces 121 of the substrate. In other words, the vertical step surface 127 can be oriented at an angle such that it is not parallel to the substrate normal 131. Additionally, tilt-oriented portions 120 can extend over vertical-step surfaces 127.

For example, the vertical step 127 can be oriented such that it is appears at an angle $\alpha$ from the substrate normal 131. Comparing FIGS. 1d-1e, $\alpha_1$ is smaller than $\alpha_2$. As the angle $\alpha$ between the substrate normal 131 and the vertical step surface approaches 90°, the resulting transmission approaches that of a conventional horizontal aperture array. Accordingly, angle $\alpha$ of the vertical-step surface from the substrate normal for vertical-dipole apertures described herein can be $0 \leq \alpha \leq 90°$, for example, 0-45°, 0-20°, 0-15°, or 0-10°.

As shown in FIG. 1f, tilt-oriented portions 120 can extend (overhang) over vertical-step surfaces 127 as shown by 120' and 120". In other words, sidewalls of adjacent tilt-oriented portions 120 can be brought closer together.

Thus, radiation through the substrate can be controlled by preselecting an appropriate combination of angle a, and/or preselecting a distance between adjacent tilt-oriented portions and thereby constraining the aperture area.

Nanoslit Array

FIGS. 3a and 3b show FDTD measurement results of optical transmission through a vertical nanoslit array having a 760-nm grating period but having two different aperture orientations, vertical or tilt-oriented (such as that in FIG. 1b) or horizontal dipoles (such as that in FIG. 1a). respectively. A TM-polarized light (633 nm wavelength) was incident with various incidence angles. As shown in FIG. 3b, the conventional nanoslit array with in-plane horizontal dipole apertures shows the $0^{th}$ order transmission (positive refraction) as the dominant beam. In contrast, as shown in FIG. 3a, for the same incidence angle 130 of the TM-polarized light at 633 nm wavelength, the vertical nanoslit array shows the $-1^{st}$ order beam only. Specifically, a 20° refraction angle for 30° incidence angle was observed which corresponds to the $-1^{st}$ order diffraction from the grating. As shown in FIG. 3c, measurements were also taken across a range of incident angles (0° to 45°).

While not bound to a particular theory, it is believed that each nanoslit aperture serves as a dipole-like line source that oscillates perpendicular to the metal film under excitation by an incident wave, as illustrated in FIG. 3d, for example. For a transverse magnetic (TM)-polarized light incident to an aperture, the metal responds by inducing surface currents. At the opposing edges across the gap, the induced currents work differently on charges, that is, accumulating charges at one edge while depleting at the other. The dipole oscillation at the aperture then reradiates the incident energy into the direction tilted away from the substrate normal. When formed into an array, the ratio of the grating period to the wavelength can be designed such that the aperture radiations make constructive interference into a certain direction that falls within the radiation pattern of individual aperture. In the language of grating diffraction, this aperture array supports only the $-1^{st}$ order diffraction (negative refraction) and blocks the $0^{th}$ order (direct transmission) and other diffraction for a wide range of incident angles.

The negative refraction at a vertical-dipole nanoaperture array is also governed by the Bragg law of diffraction gratings: $\sin \varphi = -\sin \theta - m\lambda/d$. Here $\theta$ is the incidence angle measured on the air side of substrate, and $\varphi$ is the refraction angle measured to the negative refraction direction on the exit side. d is the grating period, and $\lambda$ is the free space wavelength. m is an integer representing the diffraction order. For the case of negative refraction, as discussed herein, $m=-1$. Accordingly, the refraction relationship is then expressed as $\sin \varphi = -\sin \theta + \lambda/d$. This formula can be viewed as the Snell's law for negative refraction in the sense that it relates the incidence angle to the refraction angle at an interface of two positive-index media. (Note that in this formula, no substrate effect is involved. This is so because the incidence angle is defined on the air side, not inside the substrate.)

Optical Beam Shaping

Figure 4A:
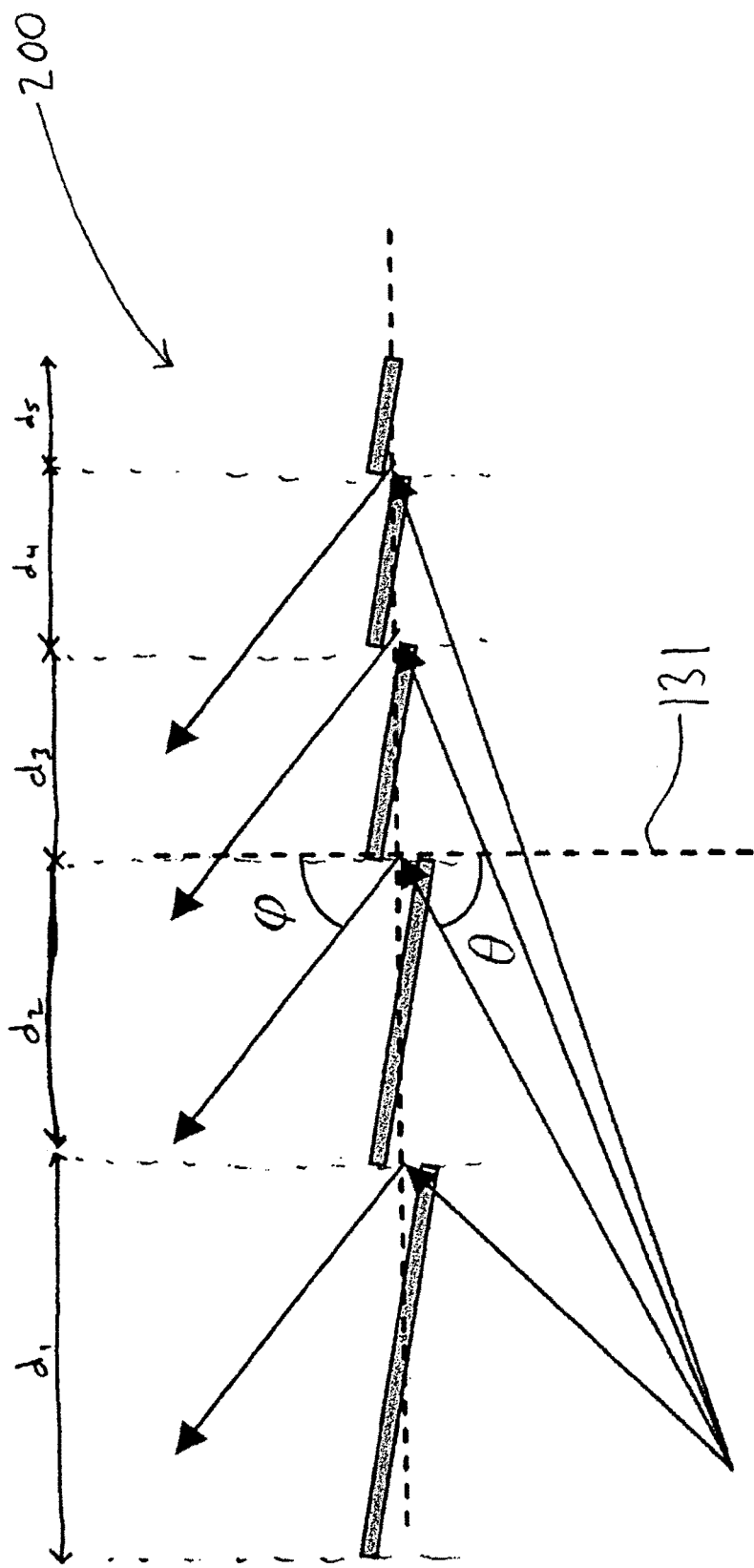
FIG. 4a illustrates negative refraction at a vertical-dipole nanoaperture with locally-varying, non-uniform grating periods.

A constant-period grating structure such as for a vertical-dipole nanoaperture array structure with tilt-oriented portions of constant periods allows negative refraction of parallel, collimated input beams. However, locally varying the grating period opens a new functionality for forming parallel-collimated output beams from non-collimated input beams or for providing non-collimated output beam profiles from parallel collimated input beams. For example, FIG. 4a illustrates negative refraction for a vertical dipole array structure having non-uniform grating periods ($d_1$, $d_2$, $d_3$, $d_4$, $d_5$).

In order to negatively refract a diverging input beam into a collimated parallel beam, the incidence and refraction angles must locally satisfy the same Bragg law as above. For a constant refraction angle $\varphi$, the local grating period must vary to match the diverging incidence angle $\theta$: $d(\theta) = \lambda/(\sin \theta + \sin \varphi)$. Similar to conventional positive refraction, an effective refractive index can be defined for negative refraction: $n = \sin \varphi/\sin \theta$. In order to keep and/or achieve a constant effective-index (note that here 'n' is defined as an absolute value) for a given incident beam profile, the grating period needs to be locally varied as follows: $d(\theta) = \lambda/[(1+n) \sin \theta]$.

Side Mirror for Rear Views without 'Mirror Imaging (inversion of right-left)' Effect In conventional mirror, the ray components of the right and left sides of a reflected image travel the same distance. Therefore as the beam propagation direction is reversed upon mirror reflection, the right-left relationship becomes flipped over (to the viewer). In the case of negative-refraction mirror reflection, the right-left relationship remains unchanged after reflection, incurring spatial displacement of outer edges in the transverse direction. In the negative-refraction beam supported by a vertical nanoslit array, the requisite phase shift to offset the phase change is provided by phase retardation in the longitudinal direction. Overall the optical path length difference for the ray components must progressively vary along the transverse direction, and this is enabled by the grating diffraction and interference effect, which is governed by the Bragg's law.

Negative refraction, as discussed above enables a new function of imaging rear views in a side forward direction, and has the effect of combining two different optics components on the same flat surface, that is, a side mirror and a side window. Accordingly, it should be noted that the reflection by a negative-refraction mirror does not incur the conventional mirror imaging', that is, inversion of the right and left sides of an image. This non-inverting mirror reflection effect can be understood in view of the ray tracing diagrams shown in FIGS. 4b-c).

Beam Focusing

Based on the vertical-dipole aperture array's intrinsic capability of shaping an aperture radiation into a desired direction, as described above, an array structure such as that shown in FIG. 5a, can perform a beam focusing function in a manner distinctly different from conventional optics. For example, each nanoaperture can be designed to serve as a nanoantenna that produces a highly directed radiation pattern to particular orientation such that the aperture radiations make constructive interference into a specific direction within the angular range of antenna radiations.

A cross sectional view of a vertical dipole aperture array 300 for focusing a planar incident wave is shown in FIG. 5a. The array 300 comprises a substrate (not shown) that supports a film 115 comprising a plurality of tilt-oriented portions 120 and a plurality of apertures. At least two of the tilt-oriented portions 120 can be separated by at least one aperture. Additionally, the tilt-oriented portions can be configured such that incident radiation is transmitted through the apertures and constructively interferes at a focal point. For example, the tilt-oriented portions can be configured at different angles relative to one another. In addition, the tilt-oriented portions configured at different angles relative to one another can also have different periods relative to each other. In one embodiment, as shown in FIG. 5a, tilt-oriented portions on one side of a focal point can be oriented with counter-clockwise angles, while the tilt oriented portions on an opposite side of the focal point can be oriented with clockwise angles such that the beams transmitted through the apertures converge at the focal point.

The phase retardation to the focal point for each aperture is designed to be $2\pi$-radian different from the phase retardation of adjacent apertures, in order that the transmitted beams can constructively interfere at the focal point. This phase retardation includes the phase-shift at the aperture transmission. The aperture orientation, e.g., the tilt-orientation, also can be tilt-adjusted in order to orient the main lobe to the focal point direction, i.e., in order to maximize the radiation intensity at the focal point. According to the Huygens-Fresnel principle, this is equivalent to altering the inclination (obliquity) factor for the benefit of achieving interference in highly selected direction/area. With use of these well-directed radiations, the resulting beam profile can be greatly improved from that of a conventional zone plate.

For instance, a conventional Fresnel zone plate consists of symmetric, alternating zones of opaque and transparent regions. Light entering the zone plate diffracts at the opaque edges and the diffracted light constructively interferes at common points. Accordingly, there is no control on the directionality of zone edge diffraction, and therefore the interference pattern usually produces multiple foci. By contrast, a vertical dipole aperture array, such as described above and shown in FIG. 5a, can produce a sharp focus at a single location in far-fields even with a relatively small number of slits.

For the case of beam focusing with normal incidence of light, negative refraction may not be involved but the transmitted radiation through the nanoapertures can be highly directed to a common point such as the focal point as described above.

Figure 5C:
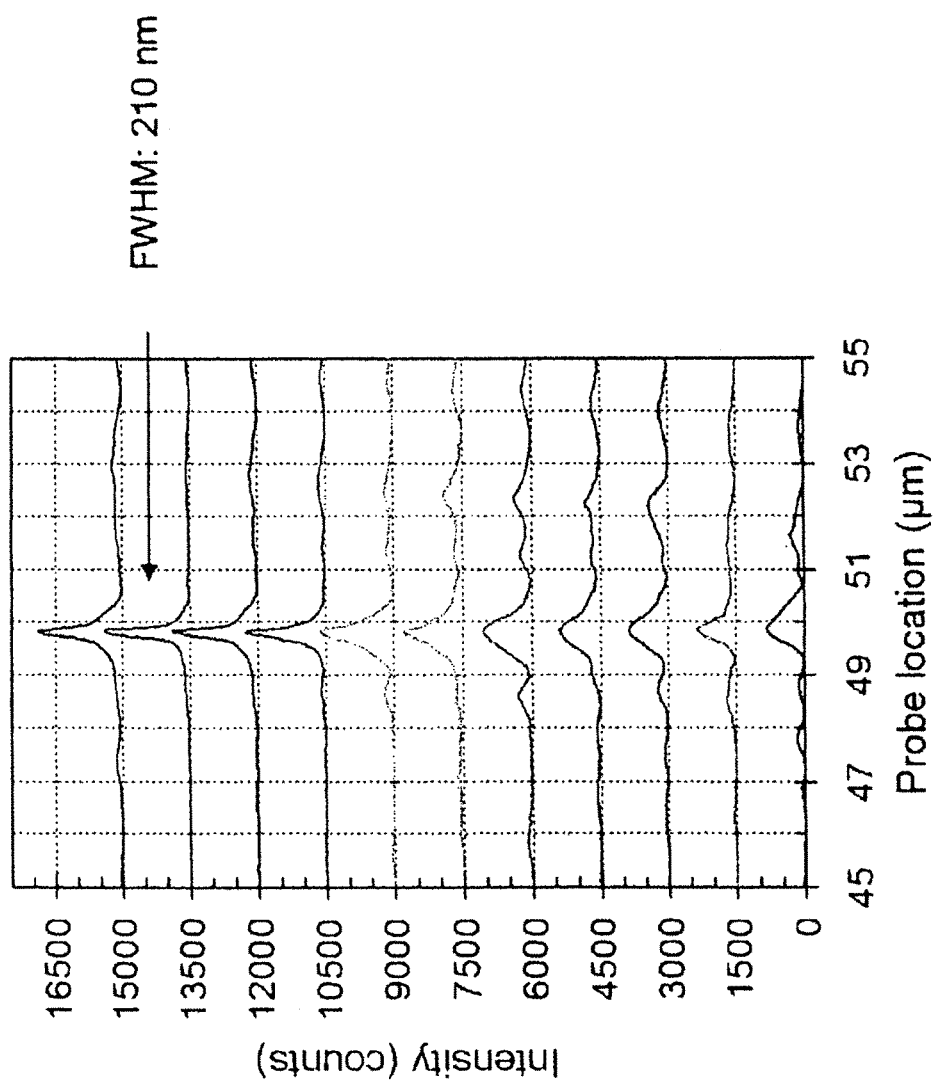
FIG. 5c shows a measured beam profile of a vertical nanoslit array lens: a beam spot size of 210 nm (FWHM) is obtained at the focal point for 633 nm wavelength light.

The highly-directed nature of radiation patterns from individual slits not only allows a single well-defined focal point in near-to-far fields, but also offers another important benefit. Unlike the case of cylindrical waves with a uniform angular distribution, which show 1/r-dependence of radiation intensity over a wide range of angle, the highly-directed aperture radiation can reach the focal point in far fields with significantly reduced attenuation. This has the effect of enhancing contributions from the slits located far from the focus and therefore of increasing the effective bandwidth of spatial frequencies on the transverse plane. This latter effect is expected to enhance the resolution of imaging. For example, FIG. 5b shows a measurement result of an array of vertical dipole nanoaperture that is designed to form a focal point at $2\lambda$ distance from the array surface. The lateral scan profile shows a FWHM of 210 nm at the focal spot (FIG. 5c). This corresponds to $\lambda/3$, which is significantly smaller than the diffraction limited spot size (~0.5 to ~1.22$\lambda$) attainable in conventional beam-shaping optics. Overcoming the diffraction limit in far field region will enable many practical applications in imaging and focusing.

Vertical Nanoaperture Arrays for Two-dimensional (2D) Beam Shaping

The vertical nanoaperture arrays described above are for 1D beam shaping functions, and they are polarization sensitive (transmit well for TM-polarized light and blocks TE waves). A cross-shaped nanoaperture (two perpendicularly superposed nanoslits), also referred to herein as "cross-apertures" 925, can transmit both TE and TM polarization components as illustrated in FIG. 9a. The large dark arrows in FIG. 9a indicate, for example, E-field direction.

By arranging the cross-shaped nanoapertures 925 into a 2D array as shown in FIG. 9b, polarization-insensitive 2D-beam shaping functions can be performed. As shown in FIG. 9c, the cross-apertures can be formed at tilt-oriented metal film portions so that the 2D-dipole axes (therefore radiation patterns) are tilted from the substrate normal. For example, cross apertures 925 can be located at tilt-oriented surfaces 121 of a substrate. Additionally, cross apertures 925 can also be formed on horizontal surfaces. Cross apertures 925 can be located at vertical-step portions 127 of a substrate (not shown).

Absorption Enhancement in Bulk and Thin Film Solar Cells

In conventional grating structures, when the grating period is designed to be small enough ($\Lambda < \lambda/2$), there will be no grating diffraction other than the 0-th order beam (direct transmission). In the case of vertical-dipole aperture arrays, the 0-th order transmission can be fully suppressed as discussed above. The transmitted light will then be sharply bent to a negative angle direction without any direct transmission. Note that the Bragg condition for m=−1 is no longer valid for the short-period grating case, since no proper grating vector is available. It is expected that the transmitted light will refract to a fixed angle independent of the beam incidence angle.

Sharp refraction of light (without direct transmission) at materials interface is potentially interesting in enhancing light absorption in materials of limited thickness. In thin-film-based photovoltaic devices, for example, by sharply bending the incident light into/inside a thin film, the interaction length within the light absorbing film can be significantly increased. The fact that the beam refraction angle remains fixed independent of incidence angle for the case of short period gratings offers an interesting possibility that the solar panels may not need to track the sun.

The funneling (field concentration) phenomenon commonly observed at metal corners does not require a plasmonic process. Also note that the negative refraction as discussed above requires grating diffraction and does not explicitly involve plasmons. Accordingly, the negative refraction phenomenon is then expected to be observable in lower conductivity metals as well. By employing 1D grating patterns, the electrical connectivity can be maintained over the electrode while the entire electrode area serves as a window that enables enhanced absorption of light through negative refraction. The thickness of electrode layer can be designed to maximize the refractive transmission while minimizing reflection and direct transmission.

Figure 6A:
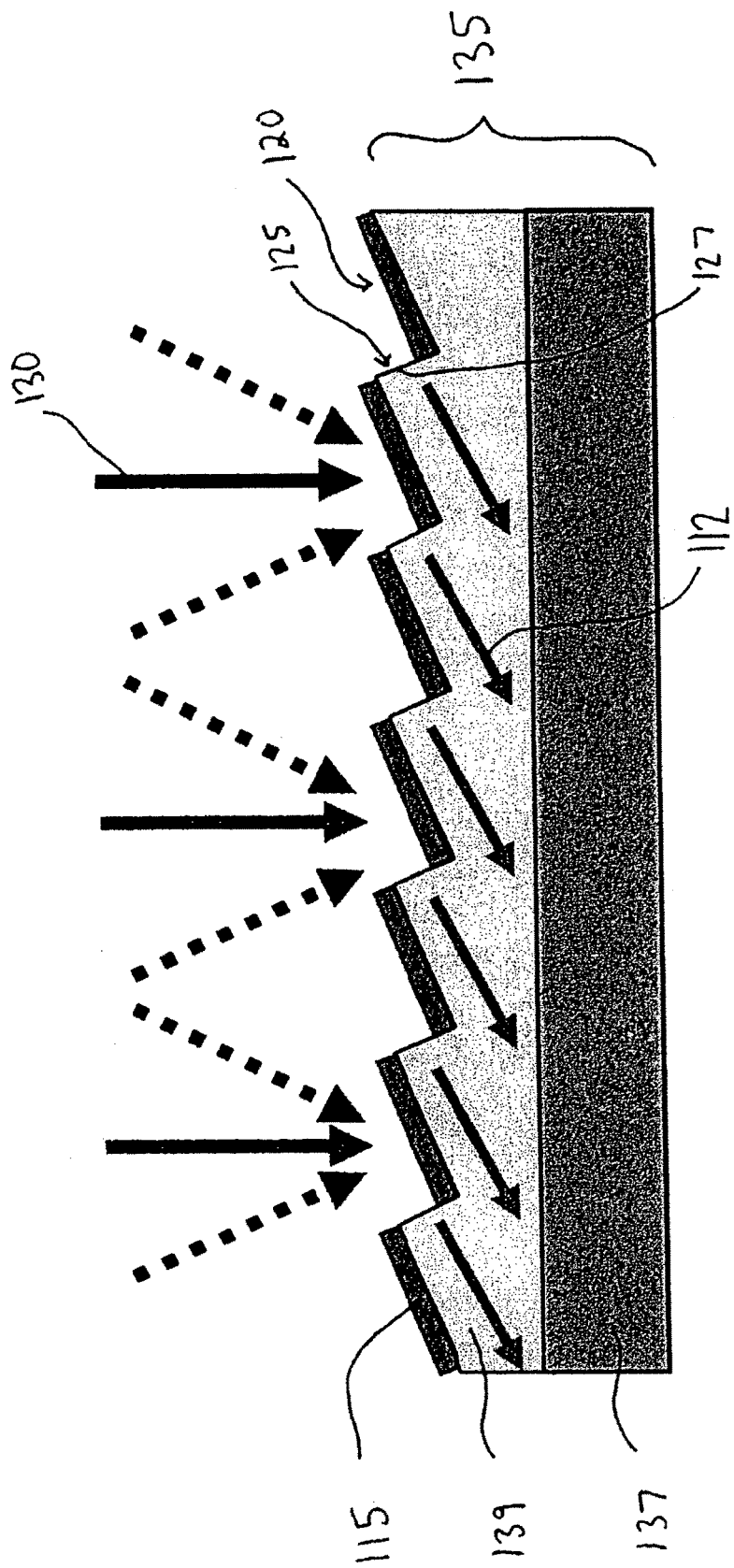
FIG. 6a illustrates a cross-sectional view of nanoslit array when used for absorption enhancement in thin film photovoltaic devices.

In one embodiment, a nanoslit array such as a vertical dipole nanoaperture array can be used for absorption enhancement in thin film photovoltaic devices. As shown in FIG. 6a, a film 115, such as an electrode is supported by a substrate 135. In this embodiment the substrate can include all the other layers in conventional photovoltaic cells that support a top, or sun-facing electrode. The electrode can be patterned into a vertical-nanoaperture array so that the incident light 130, for example sunlight, is sharply bent into the glancing angle direction without direct transmission through the film.

For photovoltaic applications, the vertical nanoaperture array structure can also operate in positive refractive direction as well, assuming the incident light is sent to a glancing angle direction. A photovoltaic device can be designed to comprise an electrode comprising a vertical-nanoaperture array formed on a film, wherein said electrode is configured such that an obliquely incident radiation directly transmits through the nanoapertured electrode with high efficiency (strong funneling effect) and the directly transmitted light propagates through the film at glancing angle. According to the data shown in FIG. 2k, the vertical nanoaperture array structure allows extraordinarily high direct-transmission of light at oblique incidence angles, e.g., 400% transmission efficiency at +45-degree incidence angle. Accordingly, this strong funneling effect can be utilized for the benefit of increasing the power capacity of a photovoltaic system by laterally stacking solar panels as shown in FIG. 6b.

Fabrication of a Vertical Nanoaperture Array Structure

Figure 7A:
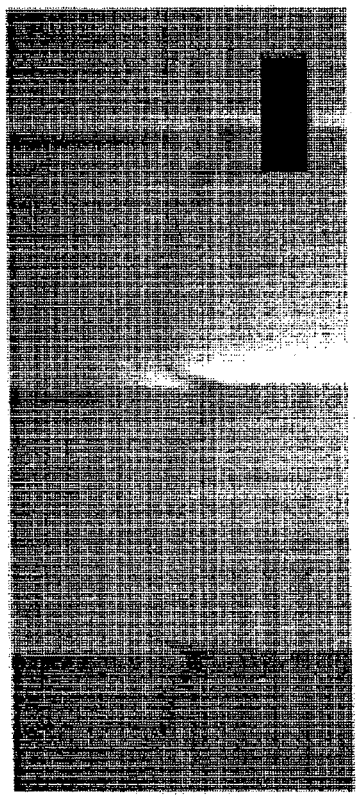
FIG. 7a is an SEM image of a perspective view of a vertical nanoaperture array (scale bar, 400 nm).
Figure 7C:
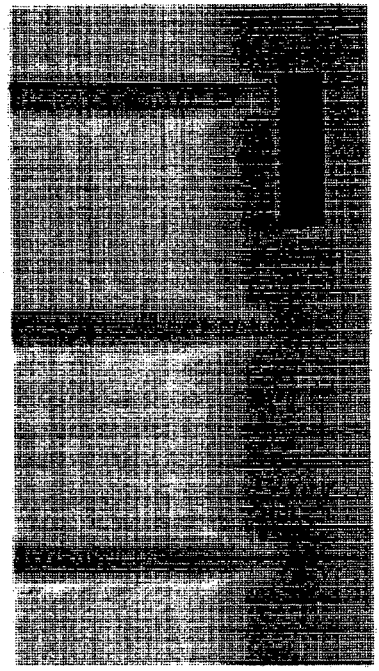
FIG. 7c is an SEM image of a cross sectional view of the horizontal nanoaperture array of FIG. 7b (scale bar, 500 nm).

A vertical nanoaperture array structure was fabricated according to the following steps. First a quartz substrate was focused-ion-beam (FIB: Seiko SMI-3050SE) etched in order to form a saw-tooth profile that contains vertical steps (200-nm height) at periodic locations (760 nm grating period). A Ga ion beam (30 keV; 10-pA beam current) was used with dwell time progressively increased for deeper etching along the grating vector direction. Each grating-period span (760 nm) was divided into 40 sub-blocks (19-nm wide and 50-μm long) in the step-wise progressive etching. A 140-nm-thick Ag layer was then deposited on the steps by thermal evaporation. In order to avoid metal deposition on the steps' sidewalls, the deposition angle was slightly tilted (10 degrees) from the substrate normal. The resulting slit width on the sidewall was estimated to be 60 nm. For a 25-period grating sample thus fabricated, the patterned area is 19 μm×50 μm. An SEM image of a perspective view of a vertical nanoaperture array is shown in FIG. 7a.

Fabrication of Large Area, Vertical Nanoaperture Array Structure

For large-area patterning of periodic or nonperiodic structures, a holographic technique or electron beam lithography can be employed, respectively. In holography, periodic grating patterns are developed on photoresist surface, followed by pattern transfer to substrates via plasma etching, and then angle deposition of metal on the mesa etched surfaces, which results in formation of an array of vertical-nanoapertures at the mesa sidewalls (FIG. 10). A UV laser (325-nm wavelength) can be utilized for holographic lithography, and with this laser the grating period as small as 350 nm (or ~250 nm period with use of index matching fluid of n=1.45) can be obtained with pattern area of ~1 cm². This holographic lithography can be employed to form two-dimensional grating structures by double exposure of 1D grating patterns with 90° rotation between exposures. For the case of non-periodic arrays of large area, electron beam lithography can be employed in conjunction with plasma etching and angle deposition. For the vertical nanoaperture fabrication described here above, a critical requirement is that the mesa depth needs to be properly designed and/or controlled in conjunction with the metal thickness of angle deposition such that the angle α between the vertical-step surface of the substrate and the substrate normal, as discussed above, can be minimized.

In one example of a fabrication process, grating patterns such as periodic grating patterns 160 are formed on photoresist 162 on a substrate 135 as illustrated in FIG. 10(a). As illustrated in FIG. 10(b), a pattern is then transferred to the substrate 135 via plasma etching 164 to form a mesa patterned substrate comprising mesa etched surfaces that define offset portions of the substrate, such as mesas 135' and mesa sidewalls 136. Subsequently, as illustrated in FIGS. 10(c)-(d), angle deposition 166 of metal on the mesa etched surfaces results in the formation of an array of vertical-nanoapertures 125 at vertical portions of the substrate such as at the mesa sidewalls 17.

This vertical nanoaperture array structure fabrication can be applied on flexible substrates such as plastic films. By bending the mesa structured substrate into properly curved shape (concave or convex) and performing angle deposition of metal on the curved substrate, the vertical nanoapertures can be formed on different sections of the substrate.

Fabrication of a Conventional Nanoslit Array

Figure 7B:
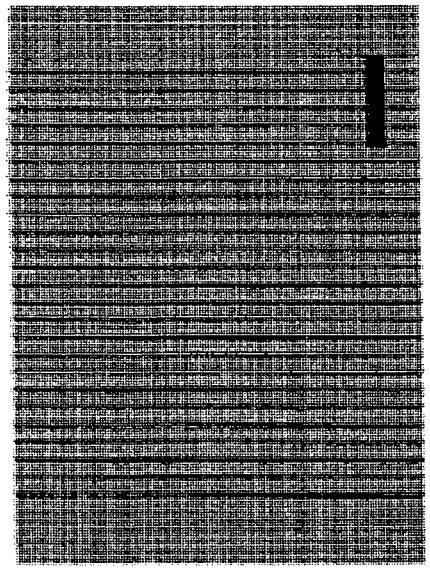
FIG. 7b is an SEM image of a top view of a horizontal nanoaperture array (scale bar, 4 μm).

Also, a conventional nanoslit array structure with in-plane horizontal dipole apertures was fabricated. SEM images of this conventional structure are shown in FIGS. 7(b) (top view; scale bar, 4 μm) and 7(c) (cross-sectional view; scale bar, 500 nm) are. First, a 140-nm-thick Ag layer was deposited on a quartz substrate by thermal evaporation of Ag. Nanoslit arrays (100 nm width and 50 μm length) were then formed in the Ag layer using a focused-ion-beam etching technique (Seiko SMI-3050-SE dual beam system: 30-keV Ga ion beam; 10-pA beam current). The typical etch depth for the nanoslits was 200 nm. The grating period of 25 slit arrays was 760 nm.

Measuring Properties of a Vertical Nanoslit Array

The profiles of optical transmission through the nanoslit arrays were imaged by scanning a nanoprobe (Veeco Aurora NSOM probe 1720-00: 100-nm-thick Al coated; 80-nm diameter aperture; formed on a tapered, single-mode silica fiber with core diameter of 4 μm and NA of 0.11; 1400 μm total length of the tapered section coated with Al; full tapered angle of 4°). TM-polarized He—Ne laser beam (633 nm wavelength, 1-mm beam diameter) was incident to the substrate side, and the scanning probe was scanned in the near- to far-field regime of the exit side of the nanoaperture array. The probe output was measured with a photomultiplier tube (Hamamatsu H7468-20). The scanning probe experiments were carried out with a home-built scanning stage setup (PI E-621.1CD for nanopositioning and E-665.CR for servo control) interfaced with LabView 7.0 (National Instruments).

Figure 8:
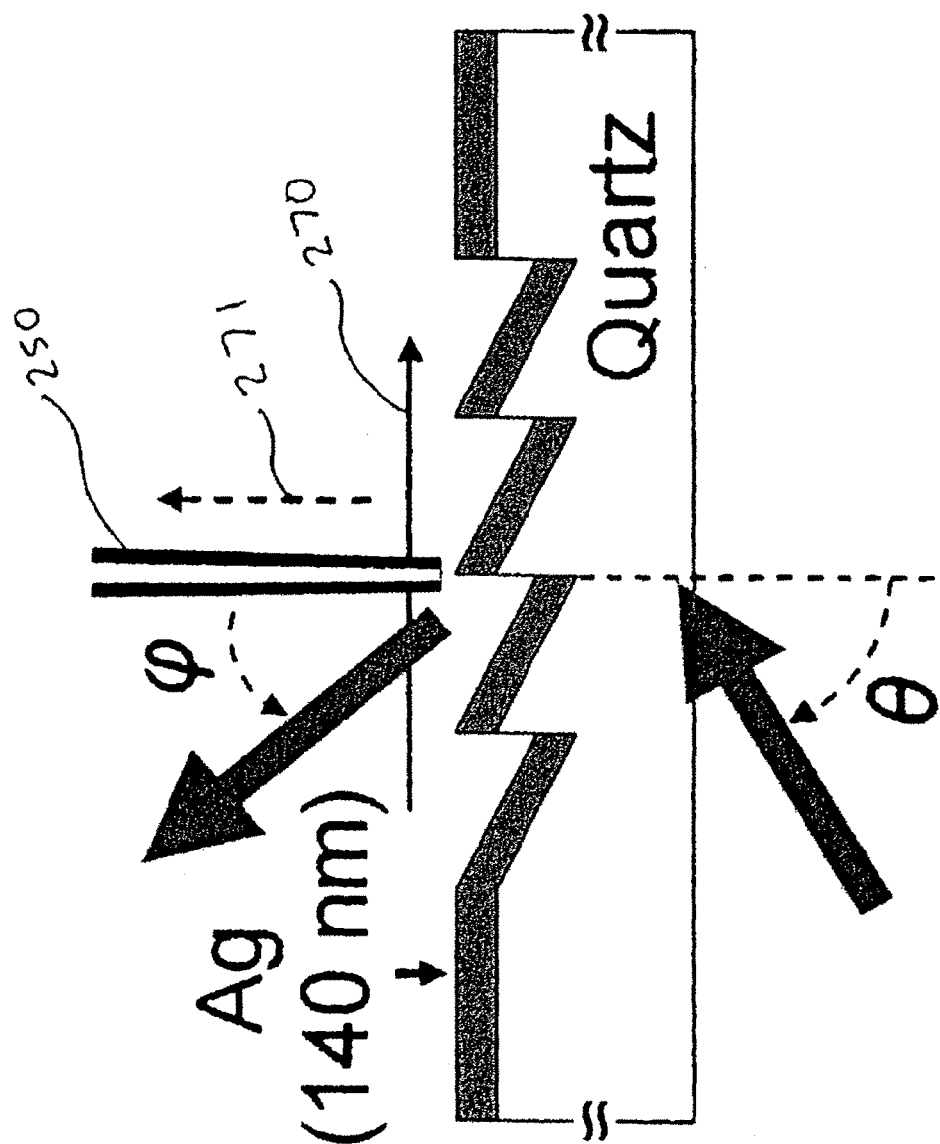
FIG. 8 illustrates diffractive transmission of light through metal nanoaperture arrays in a conventional grating of horizontal-dipole apertures.

FIG. 8 illustrates a process for profiling by scanning across an array of vertical dipole apertures with the nanoprobe fiber 250 aligned perpendicular to the substrate surface. The scan range was 60 µm on the horizontal direction (as indicated by arrow 270) and 40 µm in the vertical direction (as indicated by dashed arrow 271). The step size of scan was 50 nm and 157 nm in the horizontal and vertical directions, respectively.

Additional Embodiments

The nano-optic structure disclosed herein is designed to alter the mechanism by which incident light couples (i.e., is transmitted) into, for example, the active layer of a photovoltaic device. Unlike the case of transmission/reflection at a bulk dielectric interface, which is governed by the conventional refractive optics principles, an incident light can make glancing-angle transmission into a high-index active layer (e.g., silicon) via the nano-optic vertical dipole array. Transmission efficiency can thus be made high over a wide range of incident angles. Since the light coupled (i.e., transmitted) into the active layer propagates along the glancing angle direction (in-plane direction), the path length in the active layer can be made significantly greater than the layer thickness.

The optical transmission through the vertical dipole array can be designed to be non-reciprocal for glancing angle incidence, implying that a nano-optic electrode can also serve as a good mirror for the light glancing-angle propagating in the active layer. As illustrated in FIG. 14c, when a non-reciprocal transmission electrode 415 on a front side 405 is combined with a bottom-side reflector 407 to form a resonant cavity structure 435, an incident light 130, 130', 130" coupled into the active layer 139 becomes trapped, thereby being fully absorbed during propagation in a film direction 433.

With glancing angle transmission/propagation, most incident light can be absorbed where the junction field develops. This improves the collection efficiency of photo-generated carriers, with less dependence on the material quality, which is a feature particularly important and beneficial for thin-film solar cells.

Figure 11B:
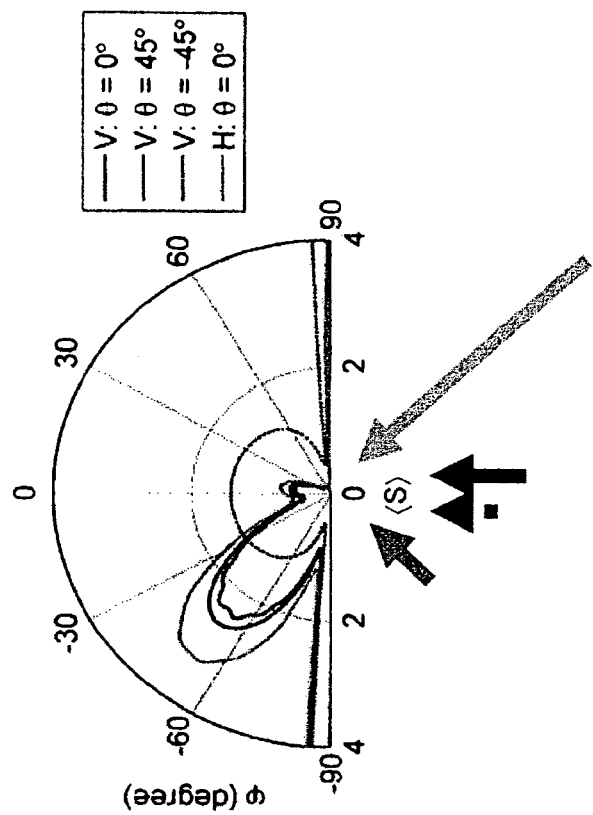
Figure 11A:
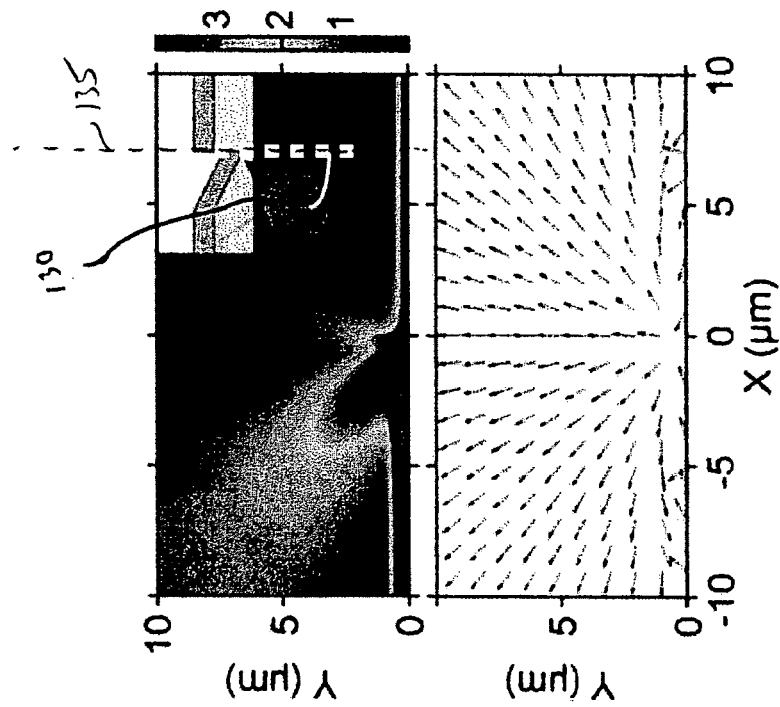

The incident-angle dependence of vertical-nanoslit transmission discussed above, with respect to the data in FIG. 11b, offers non-reciprocal transmission of light across a nano-apertured metal layer. As also discussed above, this phenomenon can be utilized for the purpose of greatly enhancing light absorption in thin-film solar cells. For example, a dielectric layer (silicon film) is sandwiched by a nanoapertured metal layer 115 and a metal film 407, as illustrated in FIG. 14c. The top electrode 115 is designed to be highly transmissive for oblique incidence. The incident light coupled into the dielectric through the nanoaperture array propagates in the glancing angle direction and is reflected back by a bottom mirror. The bottom-reflected light is now incident to the top mirror in the negative incident angle direction, for which the top electrode layer 115 is highly reflective. This configuration, combining non-reciprocal transmission with bottom-side reflection functions, allows for trapping of incident light in the vertical direction while supporting in-plane propagation of the trapped light. This increases the path length of light in the dielectric layer via multiple reflections between the two films, which act as mirrors.

The sandwich structure described above can be modeled as a Fabry-Perot cavity. The absorption enhancement in the cavity region can be expressed by the following figure of merit, F=AQ, where A is the absorbance of active layer and Q is the quality factor of the FP cavity. Q is determined by mirror reflectivities $R_1$ and $R_2$, active layer absorption coefficient $\alpha$, and film thickness t, as $$Q = \frac{4\pi}{\lambda} \frac{tn}{[1 - \exp(-2\alpha t/\cos\theta)](1 - R_1)(1 - R_2)}.$$

For a weakly absorbing medium with small film thickness ($\alpha t \ll 1$), the Q-factor can be approximated as $$Q = \frac{2\pi}{\lambda} \frac{n}{(\alpha/\cos\theta)(1 - R_1)(1 - R_2)}.$$

The Q-factor indicates the number of oscillations (round-trip reflections) to dissipate an input energy. Referring to this formula, absorption enhancement is expected to come from the following perspectives: First the glancing propagation itself has the effect of increasing the effective absorption coefficient ($\alpha/\cos\theta$), and second, the FP cavity increases the effective propagation length by a factor of $(1/[(1-R_1)(1-R_2)]$. Assuming that an incident light arrives within the angular range of acceptance cone for the vertical dipole nanoslit array and that $R_1$=0.8-0.9 for the top mirror and $R_2$=0.97-0.99 for the bottom mirror, the absorption enhancement (path length increase) in the cavity is estimated to be 170-1000. This is far greater than the conventional randomization-based Lambertian limit of $4n^2$ (~50 for n=3.5).

As discussed above, an array such as a vertical dipole nanoaperture array can be used, pursuant to the invention, to enhance absorption in thin film photovoltaic devices. For instance, a nanoaperture array of the invention can be formed on a solar cell substrate 135 or directly on the solar cell's active layer 139 as an electrode 115, such as a nano-optic electrode. Thus formed, the array can couple light into the active layer, thereby enhancing fundamental performance characteristics of the photovoltaic process, such as light absorption and photocarrier collection, leading to enhanced device efficiency. The vertical nanoaperture array directs incident light 130 into glancing angle direction 112' in the active layer, as illustrated in FIGS. 12a-12b, resulting in altered characteristics of light interaction with the dielectric. For example, vertical nanoaperture array 1200 directs incident light 130, 130', 130' into glancing angles 112', 112" in a substrate 135 by transmission through vertical nanoapertures 125 formed at vertical portions 127 of mesa sections 135' of a mesa patterned substrate 135. In nanoaperture array 1200, an electrode film 115 is comprised of offset portions 122 separated by nanoapertures 125 formed at vertical step surfaces 127. Vertical step surfaces 127 define a sidewall of mesas 135' which are formed by etching the substrate 135, as discussed above.

For a wide range of incidence angles 130, 130', 130", therefore, an inventive nanoslit array can provide a combination of high throughput and oblique transmission of light into the active layer 139, resulting in absorption enhancement by virtue of increased optical path length for a given film thickness. In other words, the vertical nanoslit array enables non-reciprocal transmission of light at oblique incidence. When integrated in a solar cell, for example, the array therefore causes incident light to be trapped in the active layer 139 and to experience multiple reflections 133 during propagation and near-complete absorption, as FIGS. 13a-13c illustrate.

The nano-optic electrode of the invention thus solves problems related to the conflicting requirements between metal thickness or coverage to provide high conductance, on one hand, and transparency requirements of conventional photovoltaic designs on the other. With glancing angle transmission and/or propagation made possible by use of the vertical nanoslit arrays of the invention, most light can be absorbed near the metal/active layer interface where the junction field develops in solar cells. This leads to improved collection efficiency of photo-generated carriers, which is a particularly important and beneficial feature for thin-film solar cells.

High throughput transmission over a wide range of incidence angles, up to and including large oblique angles, is made possible by use of nano-optic electrodes as described above. This makes solar tracking unnecessary while enabling maximum absorption of solar irradiance.

Oblique incidence mode-of-operation, pursuant to the invention, is suitable for urban-area applications. For instance, in one embodiment of the invention vertical nanoslit arrays are utilized as nano-optic electrodes on solar cells, which are integrated on photovoltaic panels (PV panels). The PV panels can be mounted on building facades, sidewalls and rooftops, thereby providing for maximum collection of incident solar energy where it typically is available only in limited amounts and in irradiance angles.

2D Array for Unpolarized Light

The vertical dipole metal nanoslit array structure discussed above assumes TM polarization of incident light. Yet, the TE polarization component of unpolarized light cannot make direct excitation of dipole oscillations on metal and, therefore, cannot transmit through the slit. In order to address this issue, i.e., to enable glancing angle transmission of this polarization component as well, an additional slit array can be formed as illustrated in FIG. 16. In such a 2D array 1600, the added grating vector is normal to the incident plane. For any incident angle, the E-field is always perpendicular to the vertical sidewalls of this added grating structure. Similar to the TM case, the nanoslit radiation pattern is tilted to the glancing angle direction. Unlike the TM case, however, the propagation direction of this nanoslit transmission is perpendicular to the incident beam direction. The 2D array can comprise at least two sets of 1D grating structures, designed for coupling of unpolarized light (both TM and TE polarization components). The 1D grating structures can be configured, for example, as the saw-tooth profiled, tilt-oriented structures described above and illustrated in FIG. 1D. At least one 1D grating structure can extend in one direction and at least one of another 1D grating structure can extend in a different direction. The 1D grating structures can extend from a common point and can be separated by an angle in the range of 0 to 90°.

As illustrated in FIG. 16a, a 2D nanoaperture array structure 1600 comprises a 1D grating structure extending in a first direction as illustrated in FIG. 16b, and another grating structure extending in a first direction as illustrated in FIG. 16c. The grating structures can share a common substrate, formed with an upper surface having a saw tooth profile on which a metal layer is deposited.

In some embodiments described above, the film is described as being supported by a substrate, but the invention is not so limited. Thus, the film may be self-supporting. In some embodiments, moreover, the tilt-oriented portions are adjustable to different angles such that the transmitted radiation direction can be adjusted. Additionally, the substrate may be flexible or rigid.

The foregoing description of the invention has been presented for purposes of illustration and description. It is not intended to be exhaustive or to limit the invention to the price form disclosed, and modifications and variations are possible in light of the above teachings or may be acquired from practice of the invention. The drawings and description were chosen in order to explain the principles of the invention and its practical application. It is intended that the scope of the invention be defined by the claims appended hereto, and their equivalents.

What is claimed is:

1. A vertical dipole array structure comprising (A) a substrate that supports (B) a film comprising a plurality of tilt-oriented portions, wherein (i) said film has a plurality of nanoapertures, (ii) at least two of said tilt-oriented portions are separated by a nanoaperture of the plurality of nanoapertures, (iii) said tilt-oriented portions are configured such that incident radiation is redirected into a negative refraction direction and through the plurality of nanoapertures, and (iv) said film is not comprised of a negative-index metamaterial, wherein the nanoapertures have a width of 40-80 nm,
wherein the tilt-oriented portions extend over vertical portions of the array structure such that sidewalls of adjacent tilt-oriented portions are parallel to each other, and the tilt-oriented portions each have a first sidewall and a second sidewall, the first sidewall being opposed in orientation to the second sidewall.

2. The vertical dipole array structure of claim 1, wherein at least two of said tilt-oriented portions are separated by more than one nanoaperture.

3. The vertical dipole array structure of claim 1, wherein the thin film comprises highly conducting material.

4. The vertical dipole array structure of claim 1, wherein the thin film comprises Ag, Au, Al, Cu, Cr, graphene, graphite, or a conducting oxide.

5. The vertical dipole array structure of claim 1, wherein the tilt-oriented portions are tilt-oriented at different angles relative to each other such that a diverging input beam is transmitted as a collimated parallel beam.

6. The vertical dipole array structure of claim 1, wherein the tilt-oriented portions are tilt-oriented at angles such that incident radiation is transmitted through the nanoapertures constructively interferes at a focal point.

7. The vertical dipole array structure of claim 1, wherein the nanoapertures are separated by uniform grating periods.

8. The vertical dipole array structure of claim 1, wherein the nanoapertures are separated by non-uniform grating periods.

9. The vertical dipole array structure of claim 1, wherein the tilt-oriented portions are configured to primarily support-1st order transmission of incident radiation.

10. The vertical dipole array structure of claim 1, wherein a surface of the substrate that supports the film comprises a saw-tooth profile comprising tilt-oriented surfaces separated by at least one vertical-step surface.

11. The vertical dipole array structure of claim 1, wherein a surface of the substrate that supports the film comprises a saw-tooth profile comprising a tilt-oriented surfaces separated by at least one vertical-step surface; and wherein the tilt-oriented surfaces are substantially parallel to each other.

12. The vertical dipole array structure of claim 1, wherein the plurality of nanoapertures define discontinuities of the thin film.

13. The vertical dipole array structure of claim 1, the substrate does not comprise a negative-index metamaterial.

14. The vertical dipole array structure of claim 1, wherein the tilt-oriented portions can be adjusted to be tilt-oriented at different angles.

15. The vertical dipole array structure of claim 1, wherein radiation is transmitted without a mirror-imaging effect.

16. The vertical dipole array structure of claim 1, wherein radiation transmitted through the nanoapertures constructively interferes at a given spot for beam focusing function with spot size smaller than about 0.5λ.

17. The vertical dipole array structure of claim 1, wherein the plurality of nanoapertures are structured to transmit a traverse magnetic polarization component and to block a transverse electric polarization component.

18. The vertical dipole array structure of claim 1, wherein a width of each nanoaperture is 60 nm.

19. A vertical dipole array structure comprising (A) a substrate that supports (B) a film comprising a plurality of tilt-oriented portions,
wherein (i) said film has a plurality of nanoapertures, (ii) at least two of said tilt-oriented portions are separated by a nanoaperture of the plurality of nanoapertures, (iii) said tilt-oriented portions are configured such that incident radiation is transmitted through the plurality of nanoapertures and constructively interferes at a focal point, and (iv) said film is not comprised of a negative-index metamaterial, wherein the nanoapertures have a width of 40-80 nm, and
wherein the tilt-oriented portions extend over vertical portions of the array structure such that sidewalls of adjacent tilt-oriented portions are parallel to each other, and the tilt-oriented portions each have a first sidewall and a second sidewall, the first sidewall being opposed in orientation to the second sidewall.

20. A vertical dipole array structure comprising (A) substrate that supports (B) a film comprising a plurality of offset portions, wherein (i) said film has a plurality of nanoapertures, (ii) at least two of said offset portions are separated by a nanoaperture, (iii) said offset portions are configured such that incident radiation is redirected into an negative refraction direction and through the plurality of nanoapertures, and (iv) said film is not comprised of a negative-index metamaterial, wherein the nanoapertures have a width of 40-80 nm,
wherein the offset portions extend over vertical portions of the array structure such that sidewalls of adjacent offset portions are parallel to each other, and the offset portions each have a first sidewall and a second sidewall, the first sidewall being opposed in orientation to the second sidewall.

21. The vertical dipole array structure of claim 20, wherein a surface of the substrate that supports the film comprises a mesa pattern.

22. A vertical dipole array structure comprising (A) a substrate that supports (B) a film comprising a plurality of tilt-oriented portions,
wherein (i) said film has a plurality of nanoapertures, (ii) at least two of said tilt-oriented portions are separated by a nanoaperture, (iii) said tilt-oriented portions are configured such that incident radiation is redirected into a positive or negative refraction direction and through the plurality of nanoapertures, and (iv) said film is not comprised of a negative-index metamaterial,
wherein the nanoapertures have a width of 40-80 nm,
wherein the vertical dipole array structure is arranged with the plurality of nanoapertures being oriented vertically with respect to the substrate such that the incident radiation is re-radiated into a direction tilted away from a direction normal to the substrate, and
wherein the tilt-oriented portions extend over vertical portions of the array structure such that sidewalls of adjacent tilt-oriented portions are parallel to each other, and the tilt-oriented portions each have a first sidewall and a second sidewall, the first sidewall being opposed in orientation to the second sidewall.

23. A vertical dipole array structure comprising (A) a substrate that supports (B) a film comprising a plurality of tilt-oriented portions, wherein (i) said film has a plurality of nanoapertures, (ii) at least two of said tilt-oriented portions are separated by a nanoaperture, (iii) said tilt-oriented portions are configured such that incident radiation is redirected only into a negative refraction direction and through the plurality of nanoapertures, and (iv) said film is not comprised of a negative-index metamaterial,
wherein the plurality of nanoapertures are structured to transmit a traverse magnetic polarization component and to block a transverse electric polarization component, and
wherein the tilt-oriented portions extend over vertical portions of the array structure such that sidewalls of adjacent tilt-oriented portions are parallel to each other, and the tilt-oriented portions each have a first sidewall and a second sidewall, the first sidewall being opposed in orientation to the second sidewall.

* * * * *